US012707646B2

(12) United States Patent
Heo et al.

(10) Patent No.: US 12,707,646 B2
(45) Date of Patent: Aug. 11, 2026

(54) MEMORY DEVICE AND ELECTRONIC DEVICE INCLUDING THE SAME

(71) Applicant: Samsung Electronics Co., Ltd., Suwon-si (KR)

(72) Inventors: Jinseong Heo, Suwon-si (KR); Taehwan Moon, Suwon-si (KR); Seunggeol Nam, Suwon-si (KR); Hyunjae Lee, Suwon-si (KR); Dukhyun Choe, Suwon-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 484 days.

(21) Appl. No.: 18/329,197

(22) Filed: Jun. 5, 2023

(65) Prior Publication Data

US 2023/0397432 A1 Dec. 7, 2023

(30) Foreign Application Priority Data

Jun. 7, 2022 (KR) ........................ 10-2022-0068988

(51) Int. Cl.
*H10B 53/20* (2023.01)
*H10B 53/10* (2023.01)
(Continued)

(52) U.S. Cl.
CPC ............. *H10B 53/20* (2023.02); *H10B 53/10* (2023.02); *H10B 53/30* (2023.02); *H10B 63/84* (2023.02);
(Continued)

(58) Field of Classification Search
CPC ........ H10B 53/20; H10B 53/10; H10B 53/30; H10B 63/84; H10B 12/30
See application file for complete search history.

(56) References Cited

U.S. PATENT DOCUMENTS 9,922,717 B1 * 3/2018 Maejima ............ G11C 16/0483
10,937,809 B1 3/2021 Sharangpani et al.
(Continued)

FOREIGN PATENT DOCUMENTS

KR 10-2016-0117854 A 10/2016
KR 10-2022-0031835 A 3/2022

OTHER PUBLICATIONS

Extended European Search Report dated Oct. 18, 2023 issued in European Patent Application No. 23177977.8-1212.
(Continued)

*Primary Examiner* — Ratisha Mehta
*Assistant Examiner* — Brad A Knudson
(74) *Attorney, Agent, or Firm* — Harness, Dickey & Pierce, P.L.C.

(57) ABSTRACT

A memory device includes a plurality of gate electrodes spaced apart from each other in a first direction, a memory layer comprising a plurality of memory regions that protrude and extend in a second direction perpendicular to the first direction to face the plurality of gate electrodes, respectively, a plurality of first insulating layers extended to spaces between the plurality of memory regions between the plurality of gate electrodes, a channel layer disposed between the memory layer and the plurality of gate electrodes, the channel layer having a shape including a plurality of first regions surrounding the plurality of memory regions and a second region that connects the plurality of first regions to each other in the first direction, and a gate insulating layer arranged between the channel layer and the plurality of gate electrodes.

17 Claims, 26 Drawing Sheets

(51) Int. Cl.

| | |
|---|---|
| ***H10B 53/30*** | (2023.01) |
| ***H10B 63/00*** | (2023.01) |
| ***H10D 1/68*** | (2025.01) |
| *H10B 12/00* | (2023.01) |

(52) U.S. Cl.

CPC ............. *H10D 1/682* (2025.01); *H10B 12/30* (2023.02); *H10D 1/692* (2025.01)

(56) References Cited

U.S. PATENT DOCUMENTS

| | | | | |
|---|---|---|---|---|
| 2011/0031544 | A1 | 2/2011 | Ozaki | |
| 2016/0293539 | A1* | 10/2016 | Park | H10B 43/50 |
| 2020/0052040 | A1 | 2/2020 | Nonoguchi et al. | |
| 2020/0395412 | A1* | 12/2020 | Lee | H10N 70/881 |
| 2021/0050371 | A1* | 2/2021 | Sharangpani | H10B 51/20 |
| 2021/0111179 | A1 | 4/2021 | Shivaraman et al. | |
| 2021/0257366 | A1 | 8/2021 | Lee | |
| 2021/0257407 | A1* | 8/2021 | Han | H10B 51/20 |
| 2021/0384221 | A1 | 12/2021 | Song et al. | |
| 2021/0391334 | A1 | 12/2021 | Servalli et al. | |
| 2022/0020756 | A1 | 1/2022 | Mariani et al. | |
| 2022/0020775 | A1 | 1/2022 | Yang et al. | |
| 2022/0077235 | A1 | 3/2022 | Kim et al. | |
| 2022/0093685 | A1* | 3/2022 | Kamata | H10B 63/84 |

OTHER PUBLICATIONS

Korean Office Action for corresponding Korean Application No. 10-2022-0068988 dated Jan. 22, 2026.

* cited by examiner

H2
340
320
370
X
Y
SU
H2
H2
340
320
330
365
370
X
Z 350a
365
370
330
320
340
350
310
SU
Z
X

MEMORY DEVICE AND ELECTRONIC DEVICE INCLUDING THE SAME

CROSS-REFERENCE TO RELATED APPLICATION

This application is based on and claims priority under 35 U.S.C. § 119 to Korean Patent Application No. 10-2022-0068988, filed on Jun. 7, 2022, in the Korean Intellectual Property Office, the disclosure of which is incorporated by reference herein in its entirety.

BACKGROUND

Various example embodiments relate to a memory device and an electronic device including the same.

A memory semiconductor is or includes a device that records and stores data by electrically controlling a semiconductor circuit. Nonvolatile or volatile memory performance is exhibited according to the type of memory material provided in the memory semiconductor.

Recently, in line with the trend of requiring technology that enables random access to memory cells, next generation memory devices, such as memory devices, including one or more of magnetic random-access memory (MRAM), phase-change random access memory (PRAM), and ferroelectric random access memory (FeRAM), and flash memory devices having advantages of ROM keeping data stored even if power is turned off, and advantages of RAM free of input and output, have been developed.

A one-transistor, one-capacitor (1T-1C) nonvolatile memory, which comprises a memory cell with a structure including one (or only one) transistor and one (or only one) capacitor based on a ferroelectric material, has the advantage of fast operation speed and/or low energy consumption. However, each memory cell requires the formation of a transistor, and it is difficult to reduce the size of a capacitor in response to a decrease in the size of the transistor, and accordingly, it is difficult to increase the degree of integration.

SUMMARY

Provided is a memory device having a structure advantageous for increasing the degree of integration.

Additional aspects will be set forth in part in the description which follows and, in part, will be apparent from the description, or may be learned by practice of various example embodiments.

According to an aspect of an embodiment, a memory device includes a plurality of gate electrodes spaced apart from each other in a first direction, a memory layer comprising a plurality of memory regions that protrude in a second direction and extend in the second direction that is perpendicular to the first direction so as to face the plurality of gate electrodes, respectively, a plurality of first insulating layers extending to spaces between the plurality of memory regions between the plurality of gate electrodes, a channel layer between the memory layer and the plurality of gate electrodes, the channel layer having a shape including a plurality of first regions surrounding the plurality of memory regions and a second region that connects the plurality of first regions to each other in the first direction, and a gate insulating layer between the channel layer and the plurality of gate electrodes.

The first region may include a first part and a third part facing each other with the memory region between the first part and the second part, and a second part arranged between the first part and the third part and facing the gate electrode.

Either or both the first and third parts may have a higher conductivity than the second part.

An area in which each of the first part and the third part faces the memory area may be 0.003 $\mu m^2$ (square microns) or more and 0.025 $\mu m^2$ (square microns) or less.

The memory device may further include a second insulating layer between the memory region and the second part.

The second insulating layer may include one or more of SiO, SiOC, or SiN, or may be an air gap.

The protruding length of the memory region may be 10 nm or more to 100 nm or less.

The length of the gate electrode in the first direction may be 20 nm or more to 100 nm or less.

The memory layer may include a ferroelectric material.

The memory layer may include at least one of an oxide of Hf, an oxide of Zr, AlScN, PZT, SBT, or BTO.

The memory layer may include a variable resistance material.

The memory layer may include an oxide of Rb, Ti, Ba, Zr, Ca, Hf, Sr, Sc, B, Mg, Al, K, Y, La, Si, Be, Nb, Ni, Ta, W, V, La, Gd, Cu, Mo, Cr, or Mn.

The channel layer may include at least one of a Si, Ge, SiGe, and III-V group semiconductor, an oxide semiconductor, a nitride semiconductor, an oxynitride semiconductor, a two-dimensional (2D) material, quantum dots, and an organic semiconductor.

The memory device may further include an insulating structure having a central axis parallel to the first direction, the memory layer may surround the insulating structure, the channel layer may surround the memory layer, and each of the plurality of gate electrodes may surround the channel layer at different positions in the first direction.

The memory device may have an outer shape of a cylindrical pillar or polygonal pillar.

The memory device may further include a stepped wiring structure including wirings extending from each of the plurality of gate electrodes by different lengths in a third direction perpendicular to the first direction.

According to various example embodiments, a memory device includes a semiconductor substrate and a plurality of memory cell strings extending in a first direction away from the semiconductor substrate and on the semiconductor substrate, and arranged in two dimensions in a second direction and a third direction, which are perpendicular to the first direction. Each of the plurality of memory cell strings includes a plurality of gate electrodes spaced apart from each other in the first direction, a memory layer including a plurality of memory regions protruding in the second direction and extending in the second direction so as to face the plurality of gate electrodes, respectively, a plurality of first insulating layers extending to spaces between the plurality of memory regions between the plurality of gate electrodes, a channel layer arranged between the memory layer and the plurality of gate electrodes, the channel layer having a shape including a plurality of first regions surrounding the plurality of memory regions and a second region that connects the plurality of first regions to each other in the first direction, and the plurality of gate electrodes.

Each of the plurality of memory cell strings may further include a cylindrical insulating structure having a central axis parallel to the first direction, the memory layer may surround the insulating structure, the channel layer may surround the memory layer, and each of the plurality of gate electrodes may surround the channel layer at different positions in the first direction.

The first region may include a first part and a third part facing each other with the memory region therebetween, and a second part arranged between the first part and the third part and facing the gate electrode, and either or both of the first and third parts may have a higher conductivity than the second part.

According to various example embodiments, an electronic device includes a memory device including a memory cell array including a plurality of memory cells, a voltage generator configured to generate a voltage to be applied to the memory cell array, and a memory controller configured to control the memory device. The memory cell array includes a plurality of gate electrodes spaced apart from each other in a first direction, a memory layer including a plurality of memory regions protruding in a second direction and extending in the second direction that is perpendicular to the first direction so as to face the plurality of gate electrodes, respectively, a plurality of first insulating layers extending to spaces between the plurality of memory regions between the plurality of gate electrodes, a channel layer between the memory layer and the plurality of gate electrodes, the channel layer having a shape including a plurality of first regions surrounding the plurality of memory regions and a second region that connects the plurality of first regions to each other in the first direction, and a gate insulating layer arranged between the channel layer and the plurality of gate electrodes.

BRIEF DESCRIPTION OF THE DRAWINGS

The above and other aspects, features, and advantages of various example embodiments will be more apparent from the following description taken in conjunction with the accompanying drawings, in which.

DETAILED DESCRIPTION

Figure 1:
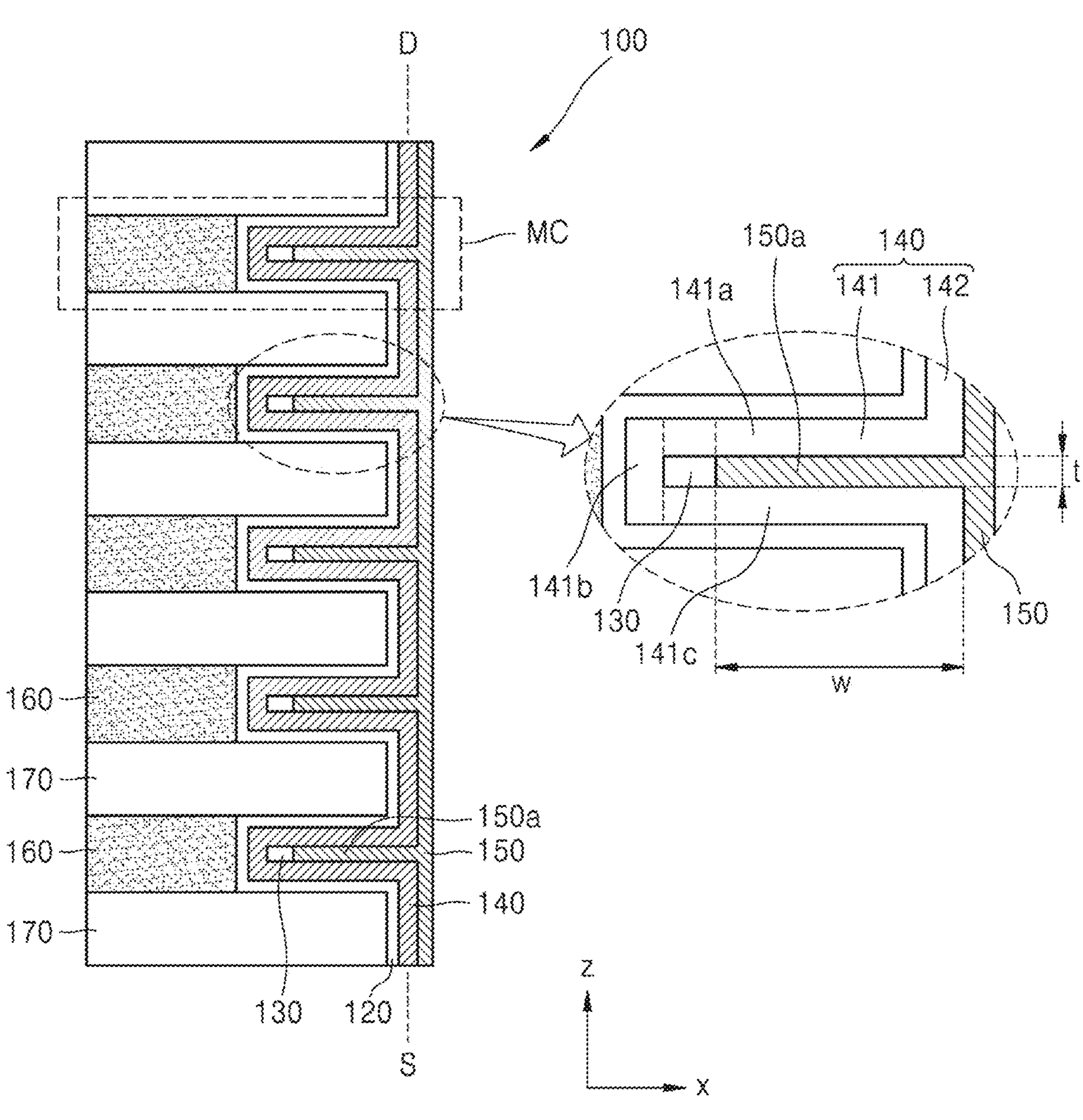
FIG. 1 is a cross-sectional view illustrating a schematic structure of a memory device according to various example embodiments.

Reference will now be made in detail to various embodiments, examples of which are illustrated in the accompanying drawings, wherein like reference numerals refer to like elements throughout. In this regard, example embodiments may have different forms and should not be construed as being limited to the descriptions set forth herein. Accordingly, various example embodiments are merely described below, by referring to the figures, to explain aspects. As used herein, the term "and/or" includes any and all combinations of one or more of the associated listed items. Expressions such as "at least one of," when preceding a list of elements, modify the entire list of elements and do not modify the individual elements of the list.

Hereinafter, embodiments will be described in detail with reference to the accompanying drawings. Various example embodiments described are merely examples, and various modifications are possible from these embodiments. In the following drawings, the same or similar reference numerals refer to the same or similar components, and the size of each component in the drawings may be exaggerated for clarity and convenience of description.

Hereinafter, the term "upper portion" or "on" may also include "to be present above on a non-contact basis" as well as "to be on the top portion in directly contact with".

Terms such as first, second, and so on may be used to describe various components, but are used only for the purpose of distinguishing one component from another. These terms do not limit the difference in the material or structure of the components.

Singular expressions include plural expressions unless they are explicitly meant differently in context. In addition, when a part "includes" a component, this means that it may further include other components, rather than excluding other components, unless otherwise stated.

Further, the terms "unit", "module" or the like mean a unit that processes at least one function or operation, which may be implemented in hardware or software or implemented in a combination of hardware and software.

The use of the term "the" and similar indicative terms may correspond to both singular and plural.

Steps constituting or included in the method may be performed in an appropriate order unless there is a clear statement or otherwise clear from context that the steps should be performed in the order described. In addition, the use of all illustrative terms (e.g., etc.) is simply intended to detail technical ideas and, unless limited by the claims, the scope of rights is not limited due to the terms.

Figure 2:
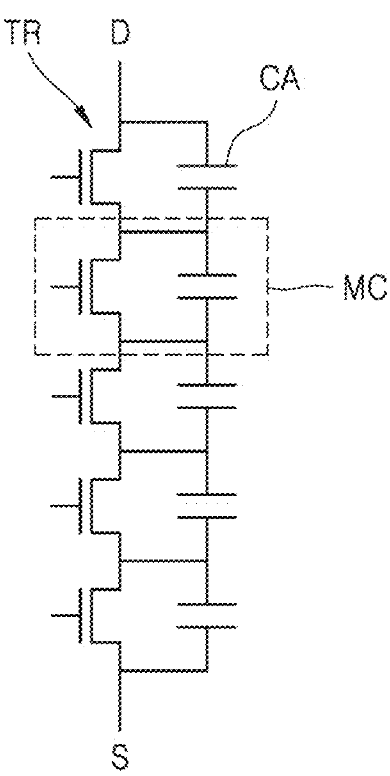
FIG. 2 is an equivalent circuit diagram of the memory device of FIG. 1.
Figure 3:
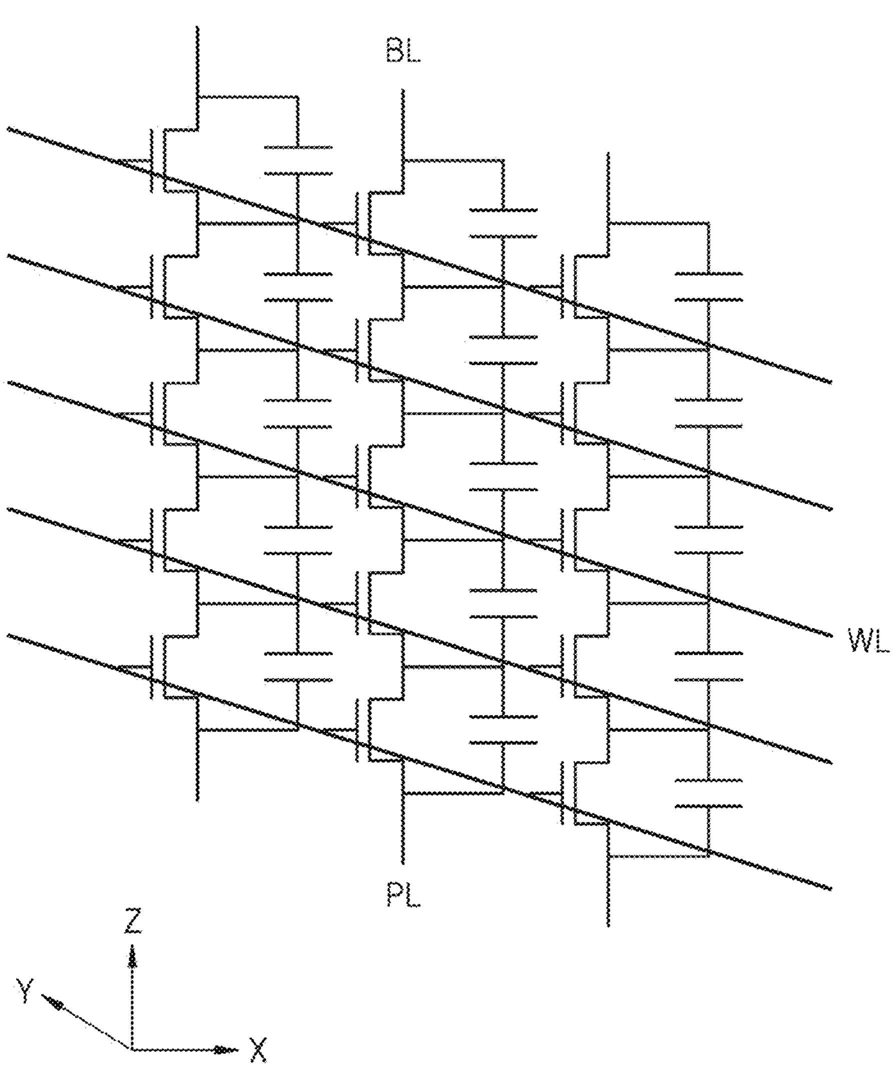
FIG. 3 is an equivalent circuit diagram in which the memory device of FIG. 1 extends into a three-dimensional chain structure.

FIG. 1 is a cross-sectional view illustrating a schematic structure of a memory device according to various example embodiments, and FIG. 2 is an equivalent circuit diagram of the memory device of FIG. 1. FIG. 3 is an equivalent circuit diagram in which the memory device of FIG. 1 extends into a three-dimensional chain structure.

A memory device 100 includes a plurality of gate electrodes 160 spaced apart from each other, a memory layer 150 having a plurality of memory regions 150*a* facing the plurality of gate electrodes 160, respectively, a first insulating layer 170 insulating between the plurality of gate electrodes 160, a channel layer 140 arranged between the memory layer 150 and the plurality of gate electrodes 160, and a gate insulating layer 120 between the channel layer 140 and the gate electrode 160. One of the gate electrodes 160, and regions of the gate insulating layer 120, the channel layer 140, and the memory layer 150, which face the gate electrode 160, form or correspond to one memory cell MC; for example, the memory device 100 includes a plurality of memory cells MCs arranged in one direction. As shown in FIG. 2, each of the memory cells MCs may form an equivalent circuit in which a transistor TR (a single transistor) and a capacitor CA (a single transistor) are connected in parallel. The capacitor CA may be or may include a ferroelectric capacitor; example embodiments are not limited thereto.

As described above, the memory device 100 may have a structure similar to that of a vertical NAND (VNAND) by arranging, in a vertical direction, memory cells MCs each in which a transistor TR and a ferroelectric capacitor CA are connected in parallel.

The plurality of gate electrodes 160 are spaced apart from each other in the first direction (Z direction). The number of and thicknesses of the illustrated gate electrodes 160 is an example and is not limited to the illustrated number. The number of gate electrodes 160 corresponds to the number of memory cells MCs individually controlled by the memory device 100, and the corresponding memory cells MCs may be controlled to be on/off according to an applied voltage. The gate electrode 160 may be connected to the word line to receive a voltage for turning on or off the memory cell MC through the word line. One or more of the gate electrodes 160 may correspond to a dummy transistor; however, example embodiments are not limited thereto.

The gate electrode 160 may include various metal materials such as W, TiN, TaN, WN, NbN, Mo, Ru, Ir, RuOx, and IrOx, or a combination of two or more thereof. The gate electrode 160 may include one or more selected from the group consisting of or the group including a metal, metal nitride, metal carbide, polysilicon such as doped polysilicon, and combinations thereof. For example, the metal may include one or more of aluminum (Al), tungsten (W), molybdenum (Mo), titanium (Ti), or tantalum (Ta), the metal nitride film may include one or more of a titanium nitride (TiN) film or a tantalum nitride (TaN) film, and the metal carbide may be an aluminum and/or silicon-doped (or contained) metal carbide, and may include, for example, one or more of TiAlC, TaAlC, TiSiC, or TaSiC. The gate electrode 160 may have a structure in which a plurality of materials are stacked. For example, the gate electrode 160 may have a stacked structure of metal nitride layer/metal layer, such as TiN/AI, and/or a stacked structure of metal nitride layer/metal carbide layer/metal layer, such as TiN/TiAlC/W. The gate electrode 160 may include a titanium nitride layer (TiN) and/or molybdenum (Mo), and the above example may be variously modified. The thickness of the gate electrode 160, for example, the length in the first direction (Z direction), may range from 20 nm to 100 nm, but is not limited thereto. The thickness of each of the gate electrode 160 may be the same as each other, or at least one gate electrode 160 may have a thickness different from at least one other gate electrode 160; example embodiments are not limited thereto.

The memory layer 150 includes the plurality of memory regions 150*a* protruding and extending in a direction crossing a first direction (Z direction), for example, in a second direction (−X direction) perpendicular to the first direction (Z direction). Three surfaces of the memory region 150*a* may be surrounded by the channel layer 140. Two surfaces of the memory region 150*a* may be in contact with (or in direct contact with) the channel layer 140 in a vertical direction. The channel layer 140 may conformally extend around the memory region 150*a*, The memory layer 150 may have a shape extending in the first direction (Z direction) while connecting the ends of the plurality of memory regions 150*a*. However, this is an example, and various example embodiments are not limited thereto. The memory layer 150 may include the plurality of memory regions 150*a* each having two surfaces which are in vertical and horizontal contact with the channel layer 140, and ends of the plurality of memory regions 150*a* may not be connected in the first direction (Z direction). The illustrated shape in which a plurality of memory regions 150*a* are connected in the first direction may be provided, for example according to convenience in the manufacturing or fabrication methods.

The memory layer 150 may include ferroelectrics. The ferroelectrics may be a material having ferroelectricity in which internal electric dipole moments are aligned to maintain spontaneous electric polarization even when an electric field is not applied thereto from the outside. Even if a constant voltage is applied to the ferroelectrics and the voltage is set to 0 V again, residual polarization (or electric field) remains semi-permanent in a material of the ferroelectrics. It is possible to implement nonvolatile memory performance by utilizing such remnant polarization.

The ferroelectrics included in the memory layer 150 may include any or all material based on HfO having a fluorite-based structure, nitride-based ferroelectrics, such as AlScN, and/or perovskite-structured ferroelectrics, such as PZT, SBT, and/or BTO. In addition, the ferroelectrics may be in or may include an orthorhombic crystal phase. For example, the ferroelectrics included in the memory layer 150 may be in or may include various crystal phases, such as an orthorhombic crystal phase and a tetragonal crystal phase, but may include the tetragonal crystal phase as dominant or in the largest ratio of all crystal phases.

The ferroelectrics may be distinguished from a high dielectric material and the like according to the presence and/or the size of residual polarization, a composition of a metal oxide, a type and/or a ratio of doping elements, a crystal phase, and the like. The type and content of each element may be measured according to various example methods, and for example, one or more of X-ray photoelectron spectroscopy (XPS), Auger electron spectroscopy (AES), inductively coupled plasma (ICP), and the like may be used. Furthermore, the crystalline phase distribution may be identified by various methods, for example, one or more of transmission electron microscope (TEM), Grazing Incidence X-ray Diffraction (GIXRD), and the like may be used.

The memory layer 150 may include at least one or more materials selected from the group consisting of hafnium oxide ($HfO_2$), zirconium oxide ($ZrO_2$), hafnium-zirconium oxide ($Hf_xZr_{1-x}O_2$, where $0<x<1$), and a combination thereof.

The memory layer 150 may include at least one or more materials selected from the group consisting of or the group including hafnium oxide ($HfO_2$), zirconium oxide ($ZrO_2$), hafnium-zirconium oxide ($Hf_xZr_{1-x}O_2$, where $0<x<1$), as a base material, and may further include at least one or more materials selected from the group consisting of or the group including C, Si, Ge, Sn, Pb, Al, Y, La, Gd, Mg, Ca, Sr, Ba, Ti, Zr, Hf and a combination thereof, as a dopant material.

The thickness of the memory layer 150, for example, the thickness of the memory region 150*a* in the first direction (Z direction) may be greater than 0 and equal to or less than 20 nm. The thickness of each memory region 150*a* may be the same, or at least one memory region 150*a* may have a thickness different from others of the memory region 150*a*. For example, "greater than 0" may refer to 0.1 nm or greater, nm or greater, 0.4 nm or greater, 0.5 nm or greater, 0.6 nm or greater, 0.7 nm or greater, 0.8 nm or greater, 1.0 nm or greater, or 1.5 nm or greater, and "equal to or less than 20 nm" may refer to equal to or less than 18 nm, equal to or less than 15 nm, equal to or less than 12 nm, equal to or less than 10 nm, equal to or less than 8 nm, equal to or less than 6 nm, equal to or less than 5 nm, equal to or less than 4 nm, equal to or less than 3 nm, equal to or less than 2 nm, or equal to or less than 1 nm. The thickness of the memory layer may be measured, and for example, an ellixometer (SE MG-1000, Nano View), etc. may be used.

The channel layer 140 is arranged between the memory layer 150 and the gate electrode 160. The channel layer 140 includes a plurality of first regions 141 surrounding the plurality of memory regions 150*a* of the memory layer 150 and a second region 142 connecting the plurality of first regions 141 to each other in the first direction (Z direction). The first region 141 includes a first part 141*a* and a third part 141*c* facing each other with the memory region 150*a* therebetween, and a second part 141*b* facing the gate electrode 160 and between the first part 141*a* and the third part 141*c*.

A second insulating layer 130 may be formed between the memory region 150*a* of the memory layer 150 and the channel layer 140. The second insulating layer 130 may serve as a separator or a separation between the transistor TR and the memory layer 150. The second insulating layer 130 may include an insulating material, for example, one or more of SiO, SiOC, SiN, or other oxides. The second insulating layer 130 may be or may define an air gap, and may or may not include air such as clean, dry air, and may or may not be in vacuum. The second insulating layer 130 may be omitted, for example, three surfaces of the memory region 150*a* may be in contact with the channel layer 140.

A region of the channel layer 140 may be divided into a region serving as a channel of the transistor TR, a region serving as an electrode of the capacitor CA, and other regions, which are shown in the equivalent circuit of FIG. 2. The first part 141*a* and the third part 141*c* of the channel layer 140 are regions serving as electrodes of the capacitor CA. The second part 141*b* of the channel layer 140 is or corresponds to a region in which a current path is turned on or off according to a voltage applied to the gate electrode 160, that is, a region serving as a channel of the transistor TR. The first part 141*a* and the third part 141*c* may have a higher conductivity than the second part 141*b*. The second region 142 may also have a higher conductivity than the second part 141*b*.

The channel layer 140 may include one or more of a Si, Ge, SiGe, or III-V group semiconductor, an oxide semiconductor, a nitride semiconductor, an oxynitride semiconductor, a two-dimensional (2D) material, quantum dots, or an organic semiconductor. The oxide semiconductor may include InGaZnO and/or IGZO, and/or the like, the two-dimensional material may include $MoS_2$, transition metal dichalcogenide (TMD), or graphene, and the quantum dots may include colloidal QDs, a nanocrystal structure, or the like. The thickness of the channel layer 140 may range from 1 nm to 20 nm. The channel layer 140 may be doped with a dopant. The doping concentration of the channel layer 140 may be different in the first part 141*a*, the second part 141*b*, and the second region 142. For example, either or both of the first part 141*a* and the third part 141*c* may have a higher doping concentration than the second part 141*b*. The first part 141*a* and the third part 141*c* may have the same dopant concentration, or the dopant concentration of the first part 14*a* may be greater than or less than the dopant concentration of the third part 141*c*. The second region 142 may also have a higher doping concentration than the second part 141*b*. Alternatively or additionally, the material described above of the channel layer 140 may be applied only to the second part 141*b* serving as a channel of the transistor TR, and another region other than the second part 141*b* may include another conductive material having higher conductivity.

The cross-sectional area where the first part 141*a* and the third part 141*c* face the memory region 150*a* may be determined, for example, considering memory performance. For example, a small or the minimum value of the length w the memory region 150*a* protrudes may be determined to be greater than or equal to a reference value capable of reading residual polarization written in the memory region 150*a*. The cross-sectional area of the memory region 150*a* may be, for example, 0.003 $\mu m^2$ (square microns) or more to 0.025 $\mu m^2$ (square microns) or less, but is not limited thereto.

The drain electrode D and the source electrode S may be connected to both ends of the channel layer 140, respectively. Referring to FIG. 3, which is an equivalent circuit diagram of a structure in which the memory device 100 of FIG. 1 extends, the drain electrode D may be connected to the bit line BL, and the source electrode S may be connected to the plate line PL. The gate electrodes 160 at the same height position may be connected to the same word line W in a plurality of strings where the memory cells MCs are arranged in the first direction (e.g., the Z direction).

The first insulating layer 170 may electrically insulate between the plurality of gate electrodes 160, and may extend to spaces between the plurality of memory regions 150*a* between the gate electrodes 160. The gate electrode 160 and the first insulating layer 170 have different widths, that is, different horizontal lengths. The gate electrode 160 and the first insulating layer 170 may be aligned with each other on one side, and the first insulating layer 170 may protrude longer in the horizontal direction than the gate electrode 160 on the other side. The length of the first insulating layer 170 protruding longer in the horizontal direction than the gate electrode 160 may correspond to the length w of the memory region 150*a* which protrudes. For example, the length of the first insulating layer 170 may range from about 10 nm to 100 nm, but example embodiments are not limited thereto.

The first insulating layer 170 includes an insulating material, and may include, for example, one or more of SiO, SiOC, or SiON. The thickness of the first insulating layer 170, that is, a length in the first direction (Z direction), may range from about 10 nm to 100 nm, but is not limited thereto.

The gate insulating layer 120 is arranged between the channel layer 140 and the plurality of gate electrodes 160. The gate insulating layer 120 may include various non-conductive materials, such as one or more of SiO, SiN, AlO, HfO, and ZrO, and may be formed of a combination of two or more. The thickness of the gate insulating layer 120 may range from about 1 nm to about 10 nm, but is not limited thereto.

Figure 4:
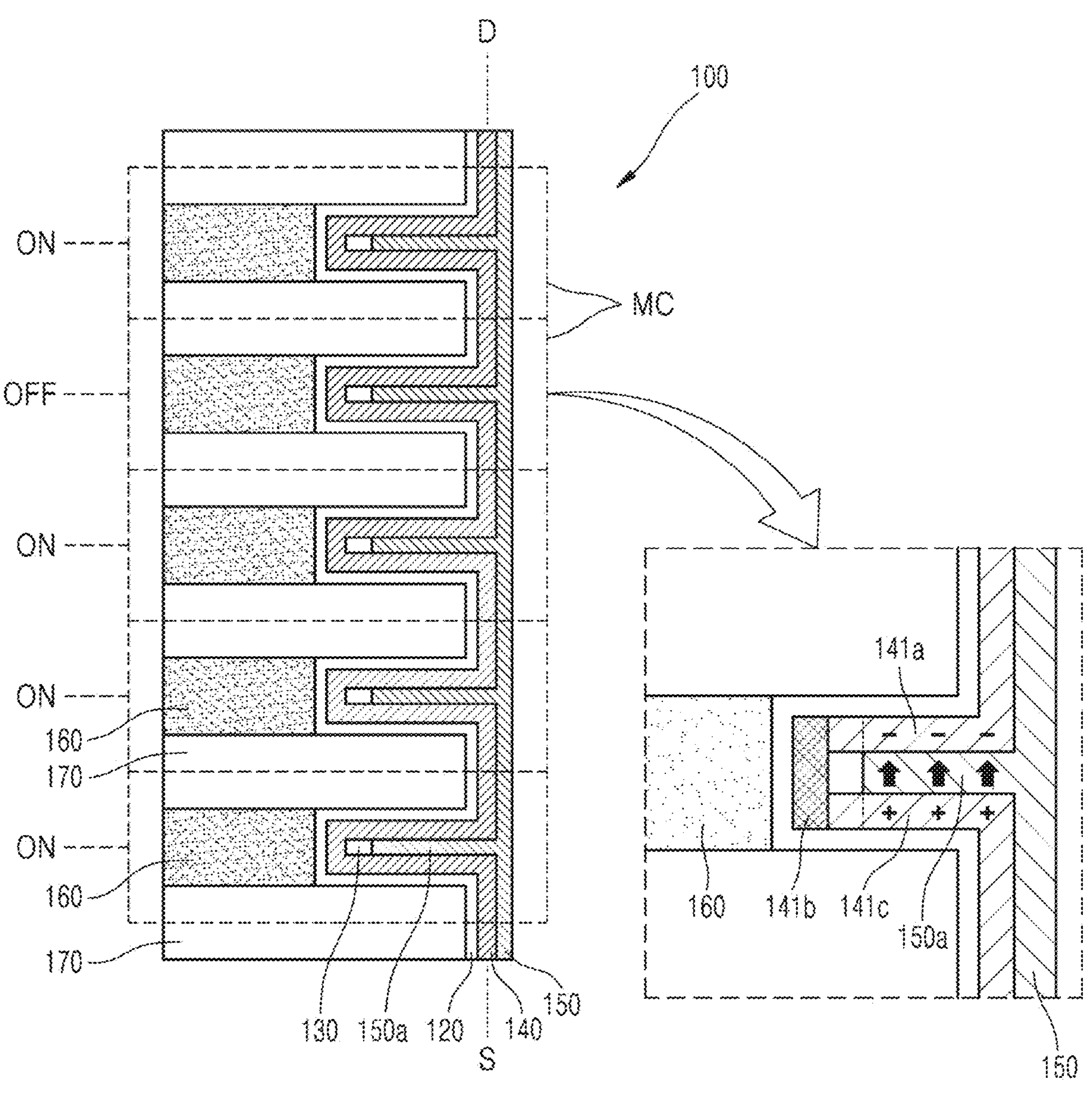
FIG. 4 is a conceptual diagram illustrating an operation of the memory device of FIG. 1.

FIG. 4 is a conceptual diagram illustrating an operation of the memory device of FIG. 1.

When the memory cell MC to be written is selected, a gate voltage value of the selected memory cell MC is adjusted so as not to form a channel in the selected cell, for example, so as to be channel-off, and the gate voltage values of the non-selected memory cells MC are adjusted such that the non-selected memory cells MCs are channel-on. For example, gate voltage values of the non-selected memory cells MC may be less than a threshold voltage of the corresponding transistors TR, while a gate voltage value of the selected memory cell MC may be greater than the threshold voltage of the corresponding transistor TR.

FIG. 4 illustrates a case in which a memory cell MC at a second position from the top is selected. A gate voltage is applied to the gate electrode 160 of each memory cell MC so that the selected memory cell MC is turned off and the other memory cells MCs are turned on. For example, the off-voltage is applied only to the word line controlling the transistor at the second position above, and the on-voltage is applied to the remaining word lines. In addition, when a voltage is applied to the bit line BL and the plate line PL of the string including the selected memory cell, a random access may be possible.

When voltages of 0 and +Vcc (or −Vcc) are applied to the bit line BL and the plate line PL, respectively, according to the voltage distribution principle of resistance, most of the voltage drop occurs in the channel region of the transistor of the selected memory cell, for example, the second part 141*b* turned channel-off and thus having very high resistance. Accordingly, electric potential of an upper part and a lower part of the region of the channel layer 140 around the second part 141*b* are 0 and +Vcc (or −Vcc), respectively, and electric potential of the first part 141*a* and the third part 141*c* facing each other with the memory region 150*a* of the memory layer 150 therebetween are 0 and +Vcc (or −Vcc), respectively. In FIG. 4, a case in which +Vcc is used is illustrated, and as illustrated, residual polarization is formed in the memory region 150*a*, which is maintained even after the Vcc is removed. When −Vcc is applied, the direction of the residual polarization is reversed, e.g., information of logical “1” or logical “0” may be written in the selected memory cell depending on whether a voltage of +Vcc, −Vcc is applied.

In the read operation, similar to the write operation, a voltage for channeling off the selected memory cell is applied to the gate electrode of the selected memory cell during the read operation for the selected memory cell. In some example embodiments, +Vcc may be used as the read voltage, and in this case, polarization switching may or may not occur according to whether +Vcc or −Vcc is applied during writing, for example, according to a direction of residual polarization. Accordingly, a sense amplifier (not shown) may read that no current flows or current flows, and may determine a memory state, for example, a memory state of a logical “1” or “0”.

Figure 5A:
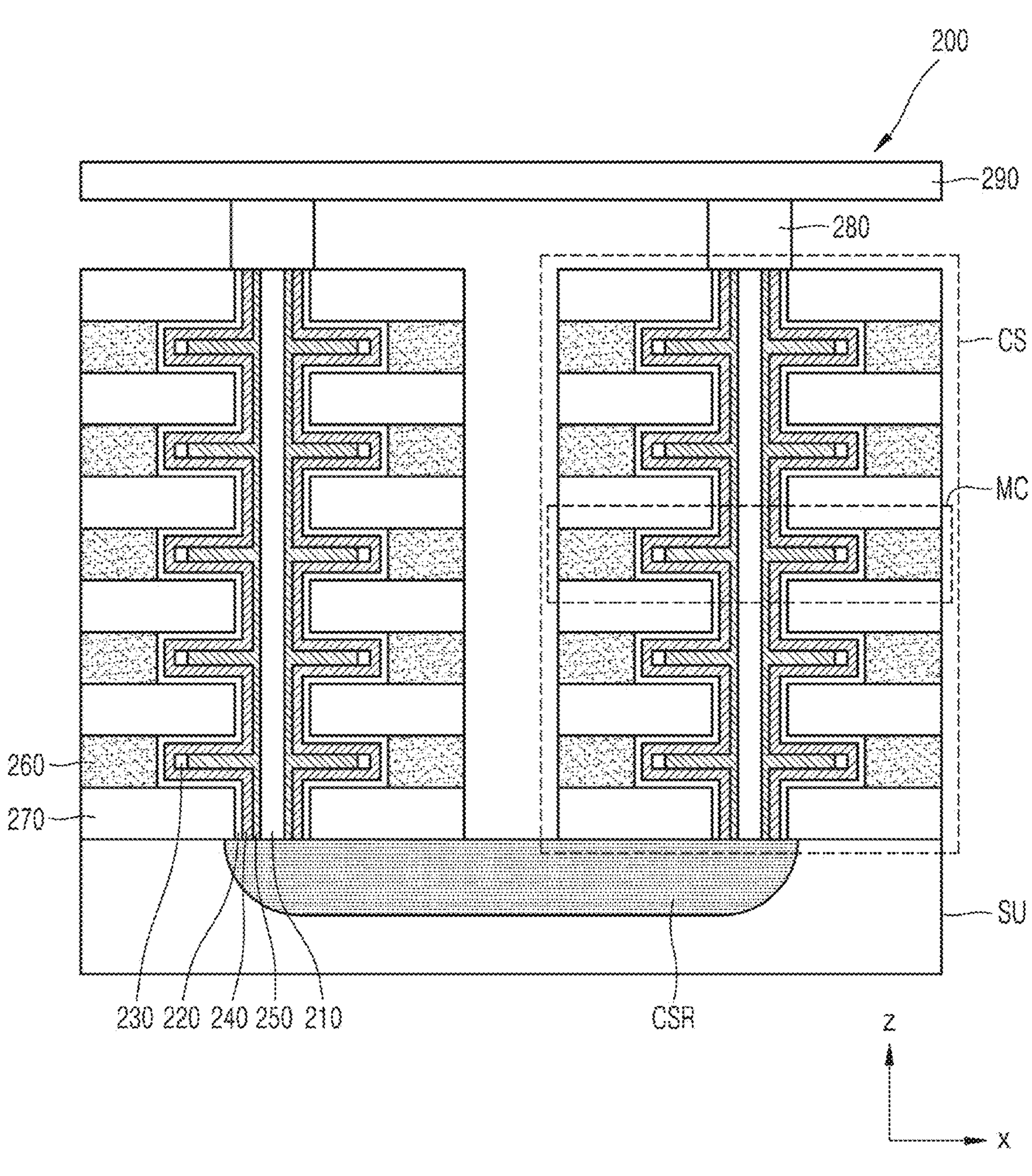
FIG. 5A is a cross-sectional view showing a schematic structure of a memory device according to various example embodiments.
Figure 5B:
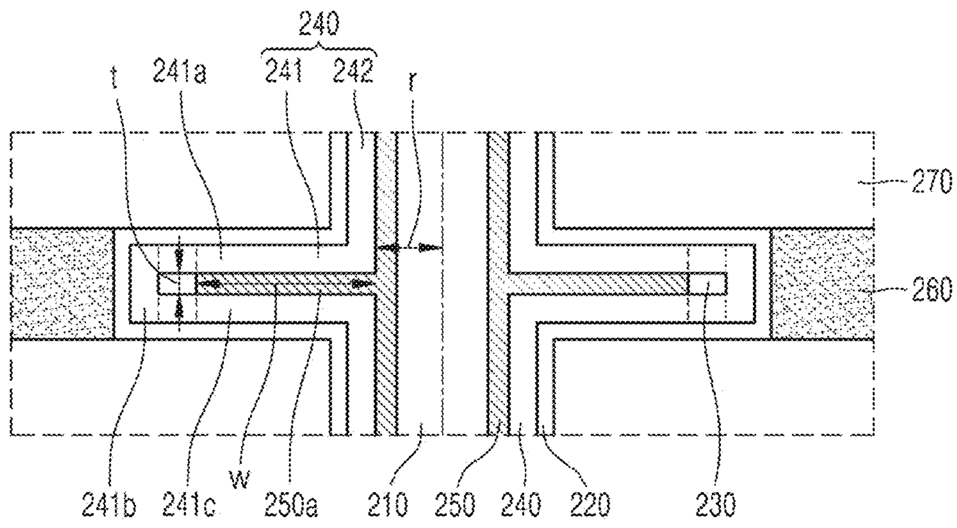
FIG. 5B is an enlarged view of a partial area of FIG. 5A.
Figure 6A:
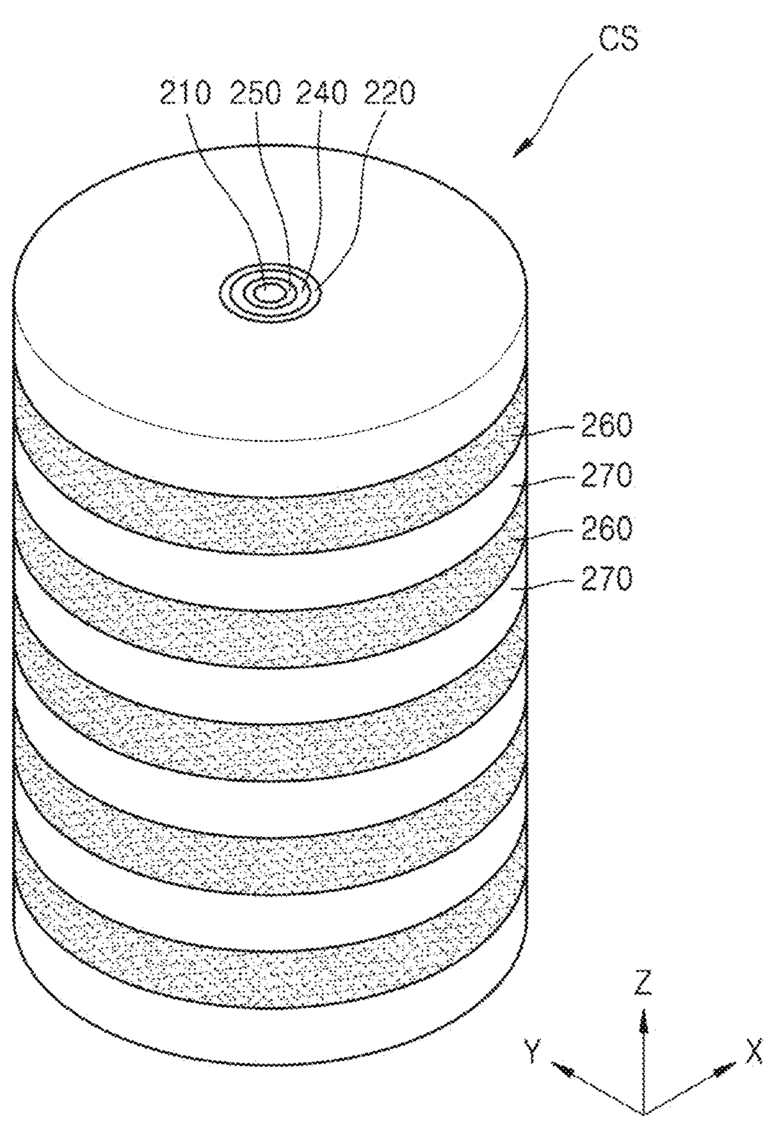
FIGS. 6A and 6B are perspective views illustrating examples of an outer appearance of a memory cell string which may be provided in the memory device of FIG. 5A.
Figure 6B:
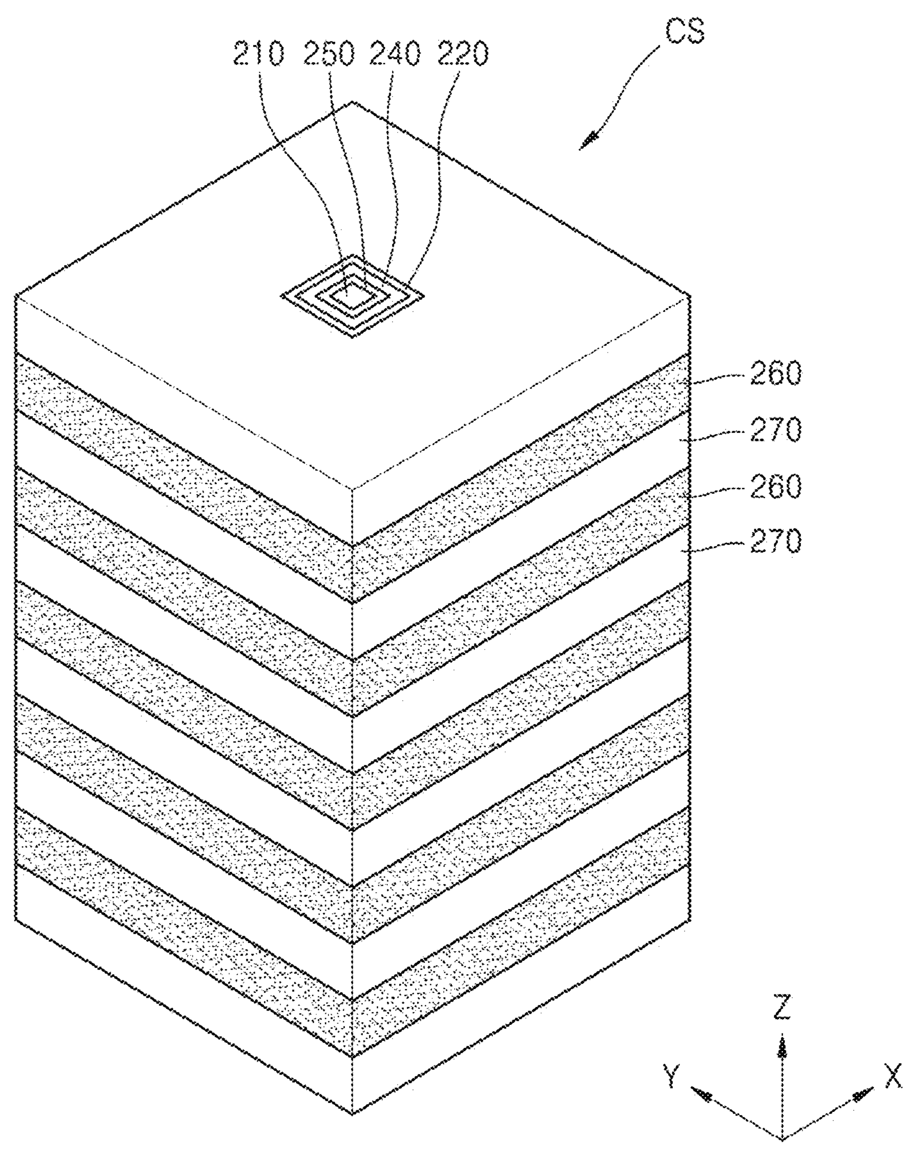
Figure 7:
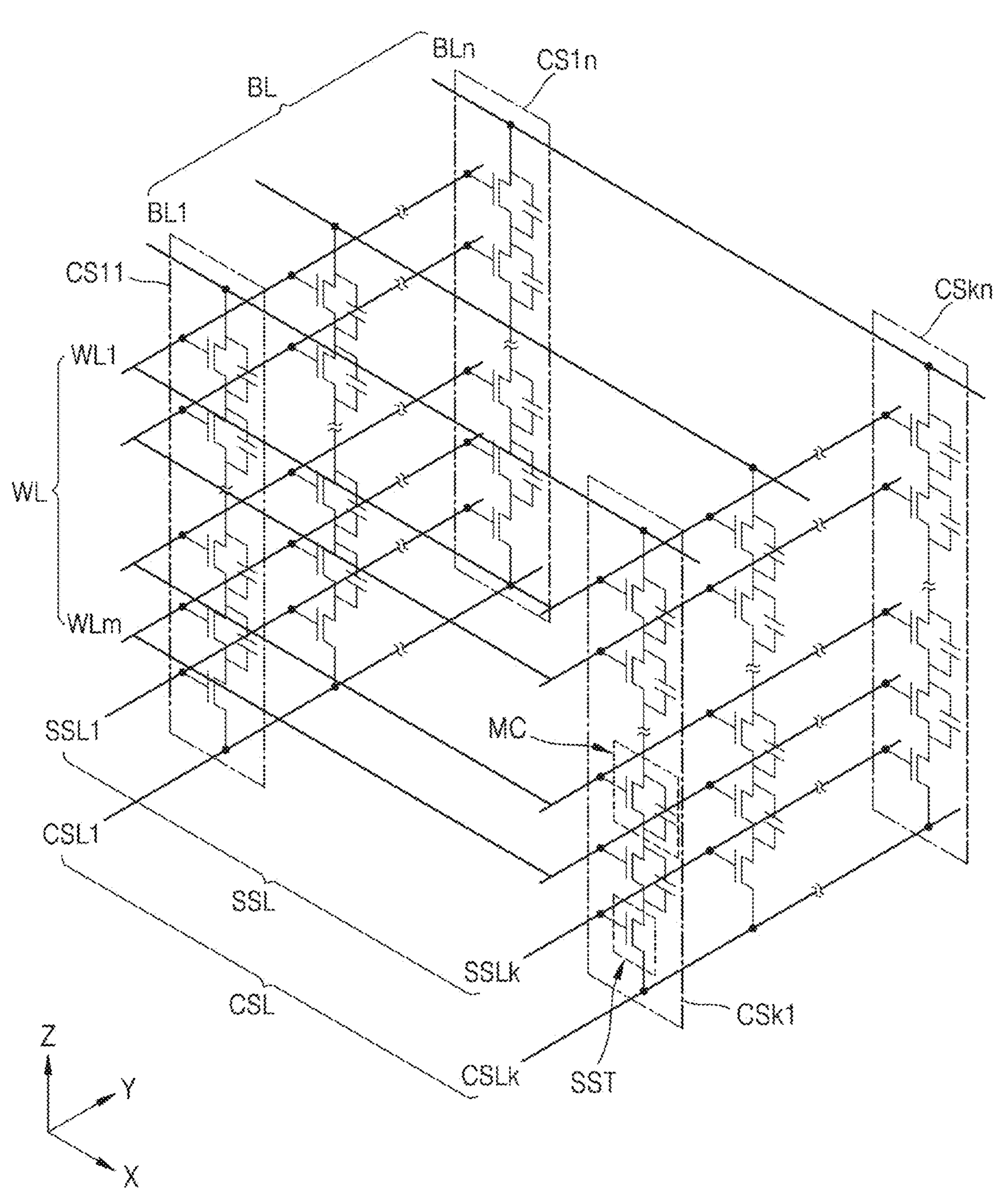
FIG. 7 is an equivalent circuit diagram of the memory device of FIG. 5A.

FIG. 5A is a cross-sectional view showing a schematic structure of a memory device according to various example embodiments, and FIG. 5B is an enlarged view of a partial area of FIG. 5A. FIGS. 6A and 6B are perspective views illustrating examples of an outer appearance of a cell string which may be provided in the memory device of FIG. 5A, and FIG. 7 is an equivalent circuit diagram of the memory device of FIG. 5A.

A memory device 200 includes a semiconductor substrate SU and a plurality of memory cell strings CSs arranged on the semiconductor substrate SU. Two memory cell strings CSs are illustrated in the drawing, but this is an example. The plurality of memory cell strings CSs may extend in a first direction (e.g. a Z direction) away from the semiconductor substrate SU, and may be two-dimensionally arranged in a second direction and a third direction perpendicular to the first direction (e.g. in an X direction and a Y direction).

A detailed configuration of the memory device 200 is described below with reference to FIGS. 5A to 7.

Referring to FIG. 5A, the plurality of memory cell strings CSs are provided on the semiconductor substrate SU.

The semiconductor substrate SU may include a silicon material doped with or lightly doped with first type impurities. For example, the semiconductor substrate SU may include a silicon material doped with p-type impurities such as boron. For example, the semiconductor substrate SU may be a p-type well (e.g., a pocket p-well). Hereinafter, it is assumed that the semiconductor substrate SU is or includes p-type silicon. However, the semiconductor substrate SU is not limited to p-type silicon.

A common source region CSR is provided on the semiconductor substrate SU. The common source region CSR may be of an n-type that is different from that of the semiconductor substrate SU. Hereinafter, it is assumed that the common source region CSR is n-type, e.g. is doped with an n-type impurity such as phosphorus and/or arsenic. However, the common source region CSR is not limited to n-type. The common source region CSR may be connected to the common source line CSL.

As illustrated in the circuit diagram of FIG. 7, k*n cell strings CSs may be provided and arranged in a matrix form, and may be referred to as CSij (1≤i≤k and 1≤j≤n) according to each row position and each column position. Each cell string CSij is connected to the bit line BL, the string selection line SSL, the word line WL, and the common source line CSL. In some example embodiments, the number of bit lines BL may be the same as, greater than, or less than the number of word lines WL. Although FIG. 7 illustrates that the cell strings CSs are arranged in a rectangular matrix, example embodiments are not limited thereto, and the cell strings CSs may be arranged in, for example, a hexagonal matrix.

Each of the cell strings CSij includes memory cells MCs and the string selection transistor SST. The memory cells MC and the string selection transistor SST of each cell string CSij may be stacked in a height direction.

Rows of the plurality of cell strings CSs are connected to different string selection lines SSL1 to SSLk, respectively. For example, the string selection transistors SSTs of the cell strings CS11 to CS1*n* are commonly connected to the string selection line SSL1. The string selection transistors SSTs of the cell strings CSk1 to CSkn are commonly connected to the string selection line SSLk.

Columns of the plurality of cell strings CSs are connected to different bit lines BL1 to BLn, respectively. For example, memory cells and string selection transistors SSTs of the cell strings CS11 to CSk1 may be commonly connected to the bit line BL1, and memory cells MCs and string selection transistors SST of the cell strings CS1*n* to CSkn may be commonly connected to the bit line BLn.

The rows of the plurality of memory cell strings CSs may be connected to different common source lines CSL1 to CSLk, respectively. For example, string selection transistors SSTs of the memory cell strings CS11 to CS1*n* may be commonly connected to a common source line CSL1, and string selection transistors SSTs of the memory cell strings CSk1 to CSkn may be commonly connected to a common source line CSLk.

Gate electrodes of memory cells MCs positioned at the same height from the semiconductor substrate SU or string selection transistors SSTs may be commonly connected to one word line WL, and gate electrodes of memory cells MCs positioned at different heights may be connected to different word lines WL1 to WLm, respectively.

The illustrated circuit structure is an example. For example, the number of rows of the memory cell strings CSs may increase or decrease. As the number of rows of the memory cell strings CSs is changed, the number of string selection lines connected to the rows of the memory cell strings CSs and the number of memory cell strings CSs connected to one bit line may also be changed. As the number of rows of the memory cell strings CSs is changed, the number of common source lines connected to rows of the memory cell strings CSs may also be changed.

The number of columns of the memory cell strings CSs may increase or decrease, and may be the same as, greater than, or less than the number of rows. As the number of columns of the cell strings CSs is changed, the number of bit lines connected to the columns of the memory cell strings CSs and the number of cell strings CSs connected to one string selection line may also be changed.

The height of the memory cell string CS may also increase or decrease. For example, the number of memory cells MCs stacked in each of the memory cell strings CSs may increase or decrease. As the number of memory cells MCs stacked in each of the memory cell strings CSs is changed, the number of word lines WLs may also be changed. For example, the number of string selection transistors provided in each of the memory cell strings CSs may increase. As the number of string selection transistors provided to each of the memory cell strings CSs is changed, the number of string selection lines or common source lines may also be changed. When the number of string selection transistors increases, the string selection transistors may be stacked in the same form as the memory cells MCs.

For example, write and/or read operations may be performed in units of rows of cell strings CSs. The memory cell strings CSs may be selected in units of one row by the common source lines CSLs, and the memory cell strings CSs may be selected in units of one row by the string selection lines SSLs. Also, a voltage may be applied to the common source lines CSLs in units of at least two common source lines. A voltage may be applied to all the common source lines CSLs in units of all the common source lines CSLs.

In a selected row of the memory cell strings CSs, write and/or read operations may be performed in units of pages. The page may be one row of memory cells connected to one word line WL. In the selected row of the memory cell strings CSs, the memory cells may be selected in units of a page by the word lines WLs.

As shown in FIG. 6A, the memory cell string CS may have a cylindrical shape. As shown in FIG. 6B, the memory cell string CS may have a rectangular pillar or prismatic shape. In addition, the memory cell string CS may have an elliptical pillar shape and/or a polygonal pillar shape. The following description is of a cylindrical memory cell string CS, but is not limited thereto.

The memory cell string CS includes a cylindrical insulating structure 210 having a central axis in a first direction (Z direction) positioned at a central part thereof. The cylindrical insulating structure 210 may include various types of insulating materials. A memory layer 250, a channel layer 240, and a gate insulating layer 220 may sequentially surround the insulating structure 210 as a sequence stated above.

The memory layer 250 includes a memory region 250*a* protruding and extending in a direction perpendicular to the first direction (Z direction), and the memory region 250*a* has a disk or annular shape having a hollow central part of an inner radius r, an outer radius r+w, and a thickness t, as shown in FIG. 5B. The memory layer 250 may include a ferroelectric material, and may include various materials in the memory layer 250 described with reference to FIG. 1.

The channel layer 240 includes a plurality of first regions 241 surrounding the plurality of memory regions 250*a* of the memory layer 250 and a second region 242 connecting the plurality of first regions 241 to each other in the first direction (Z direction). The first region 241 includes a first part 241*a* and a third part 241*c* facing each other with the memory region 250*a* therebetween, and a second part 241*b* facing the gate electrode 260 and connecting the first part 241*a* and the third part 241*c* to each other.

A region of the channel layer 240 may be divided into a region serving as a channel of the transistor TR, a region serving as an electrode of the capacitor CA, and other regions, which are shown in the equivalent circuit of FIG. 7. The first part 241*a* and the third part 241*c* of the channel layer 240 are regions serving as electrodes of the capacitor CA. The second part 241*b* of the channel layer 240 is a region in which a current path is turned on or off according to a voltage applied to the gate electrode 260, that is, a region serving as a channel of the transistor TR. The first part 241*a* and the third part 241*c* may have a higher conductivity than the second part 241*b*. The second region 242 may also have a higher conductivity than the second part 241*b*.

The channel layer 240 may include a semiconductor material doped with a p-type and/or an n-type, e.g. may include a semiconductor material predominantly doped with a p-type, or alternatively may include a semiconductor material predominantly doped with an n-type material. The channel layer 240 may include a silicon material doped with the same type as the semiconductor substrate SU. For example, when the semiconductor substrate SU includes a silicon material doped p-type, the channel layer 240 may also include a silicon material doped p-type. The doping concentration of the channel layer 240 may be different in the first part 241*a*, the second part 241*b*, and the second region 242. For example, either or both the first part 241*a* and the third part 241*c* may have a higher doping concentration than the second part 241*b*. The second region 242 may also have a higher doping concentration than the second part 241*b*. The channel layer 240 may include various materials of the channel layer 140 of FIG. 1. Alternatively or additionally, the material of the channel layer 240 may be applied only to the second part 241*b* serving as a channel of the transistor TR, and another region may include another conductive material having higher conductivity.

The outermost layer of the memory cell string CS is a first insulating layer 270 and a gate electrode 260, which are alternately arranged in a first direction (Z direction). The first insulating layer 270 and the gate electrode 260 may include various materials illustrated as materials of the first insulating layer 170 and the gate electrode 160 in FIG. 1, respectively.

The gate electrode 260 is connected to one of the word line WL and the string selection line SSL.

The channel layer 240 may be in contact with a common source region CSR, that is, a common source region.

A drain region 280 may be provided on the memory cell string CS. The drain region 280 may include a silicon material doped with a second type. For example, the drain region 280 may include an n-type doped silicon material.

A bit line 290 may be provided on the drain region 280. The drain region 280 and the bit line 290 may be connected through contact plugs.

Each gate electrode 260 and regions of the gate insulating layer 220, the channel layer 240, and the memory layer 250, which face the gate electrode 260 in the horizontal direction (X direction), form a memory cell MC. For example, the memory cell MC has a circuit structure in which a transistor including a gate electrode 260, a gate insulating layer 220, and a second part 241_b_ of the channel layer 240, and a ferroelectric capacitor including a first part 241_a_ and a third part 241_c_ of the channel layer 240, and a memory region 250_a_ are connected in parallel.

The parallel connection structure is continuously arranged in a vertical direction (Z direction) to form a memory cell string CS. In addition, the common source line CSL and the bit line BL may be connected to both ends of the memory cell string CS, respectively, as shown in the circuit diagram of FIG. 7. By applying a voltage to the common source line CSL and the bit line BL, a program, read, and erase process may be performed on the plurality of memory cells MCs.

For example, when the memory cell MC to be written is selected, a gate voltage value of the corresponding cell is adjusted so that a channel is not formed in the selected memory cell, that is, the channel is turned off, and gate voltage values of non-selected memory cells are adjusted so that the non-selected memory cells are turned on, that is, the channel is turned on. In addition, when a voltage of Vcc or −Vcc is applied between a bit line BL of a memory cell string including a selected memory cell and a common source line CSL, most voltage drops occur in a channel region of a transistor of a selected memory cell being channel off and having very high resistance. Accordingly, polarization may be formed in the direction of an electric field formed in the memory region 150_a_ of the ferroelectric capacitor connected in parallel with the transistor, and information of “1” or “0” may be written in the selected memory cell.

Even in the read operation, similarly, read of the selected memory cell may be performed. For example, after the gate voltage applied to each gate electrode 260 is adjusted such that the selected memory cell MC is channel-off and the non-selected memory cells are channel-on, the cell state (1 or 0) may be checked by measuring a current flowing in the corresponding cell MC by an applied voltage $V_{read}$ between the common source line CSL and the bit line BL. For example, +Vcc may be used as the read voltage, and in this case, polarization switching may or may not occur according to whether +Vcc or −Vcc is applied during writing, that is, according to a direction of residual polarization. Accordingly, the sense amplifier may read that no current flows or current flows, and may determine a memory state, that is, a memory state of “1” or “0”.

Figure 8:
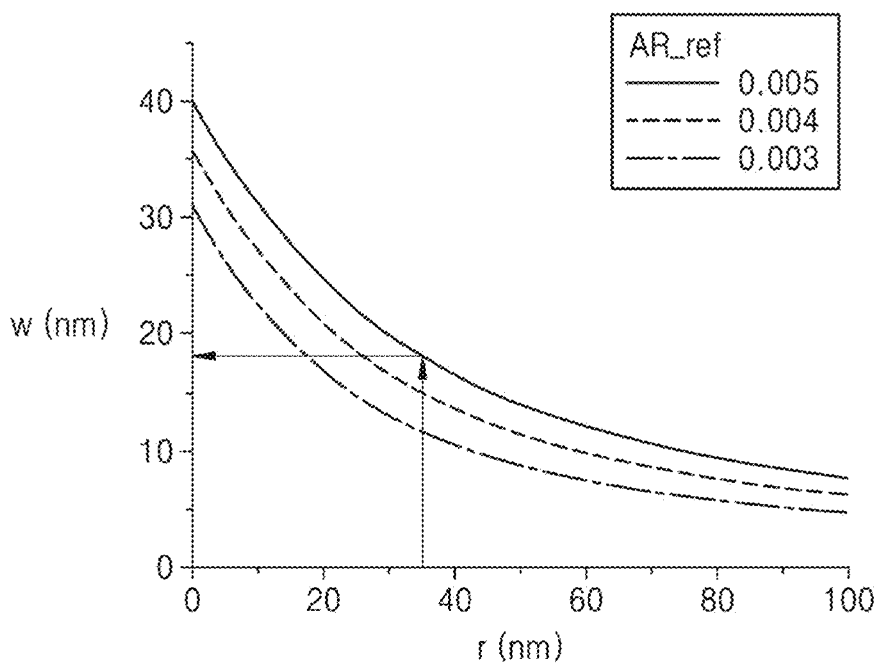
FIG. 8 is a graph for describing a criterion for determining a detailed size of a memory cell constituting the memory device of FIG. 5A.

FIG. 8 is a graph for describing a criterion for determining a detailed size of a memory cell MC constituting the memory device of FIG. 5A.

The size of the memory cell MC at least partly depends on the protruding length w of the memory region 150_a_ and the radius r of the insulating structure 210 located at the center of the memory cell string CS. These shape dimensions w and r are related to a cross-sectional area where the first part 141_a_ and the third part 141_c_ serving as electrodes of the ferroelectric capacitor face the memory region 150_a_. The minimum cross-sectional area may be set considering the performance of a sense amplifier used in a read operation. The shape dimension of the cross-sectional area may be set greater than or equal to a minimum cross-sectional area in that charge change of the capacitor may be read by the sense amplifier. Hereinafter, the minimum cross-sectional area is referred to as a reference area AR_ref.

Based on the readable electrode area for a commercial DRAM capacitor, the readable reference area AR_ref may be determined for the memory cell according to various example embodiments. To this end, a function value φ indicating a ratio of an amount of charge per unit area of the ferroelectric capacitor provided in the memory cell MC of various example embodiments to an amount of charge per unit area of the commercial DRAM capacitor may be considered. For example, when φ is at least 1 or more, a valid operation of the memory device 100 is possible. Assuming that the area of the DRAM electrode which is currently mass-produced is 0.025 $\mu m^2$ (square microns) the readable reference area AR_ref may be determined. In this case, the reference area AR_ref may be determined to be 0.025/φ $\mu m^2$ (square microns). As φ increases, the reference area AR_ref required or expected for the memory cell MC may decrease. When φ is 1, the reference area AR_ref is 0.025 $\mu m^2$ (square microns) that is, the minimum cross-sectional area values of the first part 241_a_ and the third part 241_c_ facing the memory area 250_a_ may be 0.025 $\mu m^2$ (square microns). When φ is equal to or greater than 1, the cross-sectional areas of the first part 241_a_ and the third part 241_c_ facing the memory region 250_a_ may be designed to be equal to or less than 0.025 $\mu m^2$ (square microns).

The graph of FIG. 8 shows w and r suitable when the reference areas AR_ref are 0.005 $\mu m^2$ (square microns), 0.004 μm (square microns), and 0.003 $\mu m^2$ (square microns) for example, when the values of φ correspond to 5, 25/4, and 25/3, respectively. In each of the memory cells MC of the memory device 200 according to various example embodiments, since the memory region 250_a_ has a disk shape of a hollow central part having an inner radius r and an outer radius r+w, r and w for satisfying the reference area AR_ref of the first part 141_a_ facing the memory region 250_a_ are inversely proportional, as shown in a graph. In order to meet the reference area AR_ref of 0.005 $\mu m^2$, values of w and r at the displayed position may be used, or other combinations thereof may be used. Since the volume of the memory cell string CS is proportional to r+w, a combination of r and w that satisfy a dynamically determined or predetermined reference area AR_ref and minimizes or reduces an r+w value may be selected in order to effectively increase memory density.

The larger the φ, the smaller the reference area, and thus the better the memory density. φ appears to increase as the residual polarization value Pr of the memory region 250_a_ increases, and for this purpose, the thickness t of the memory region 250_a_ may be determined. When t is increased, Pr is increased and the reference area AR_ref may be reduced, but since the length in the Z direction is increased, the thickness t of the memory region 250_a_ may be set to effectively increase the memory density.

The thickness t of the memory region 250_a_ may be greater than 0 nm and less than or equal to 20 nm. For example, “greater than 0” may refer to 0.1 nm or greater, nm or greater, 0.4 nm or greater, 0.5 nm or greater, 0.6 nm or greater, 0.7 nm or greater, 0.8 nm or greater, 1.0 nm or greater, or 1.5 nm or greater, and “equal to or less than 20 nm” may refer to equal to or less than 18 nm, equal to or less than 15 nm, equal to or less than 12 nm, equal to or less than 10 nm, equal to or less than 8 nm, equal to or less than 6 nm, equal to or less than 5 nm, equal to or less than 4 nm, equal to or less than 3 nm, equal to or less than 2 nm, or equal to or less than 1 nm.

A value of r+w of the memory cell string CS, that is, a distance from a central axis of the memory cell string CS to one end of the memory region 250*a* extending, may be, for example, about 20 nm or greater to 300 nm or less, or 250 nm or less, 200 nm or less, 150 nm or less, or 100 nm or less.

Figure 9:
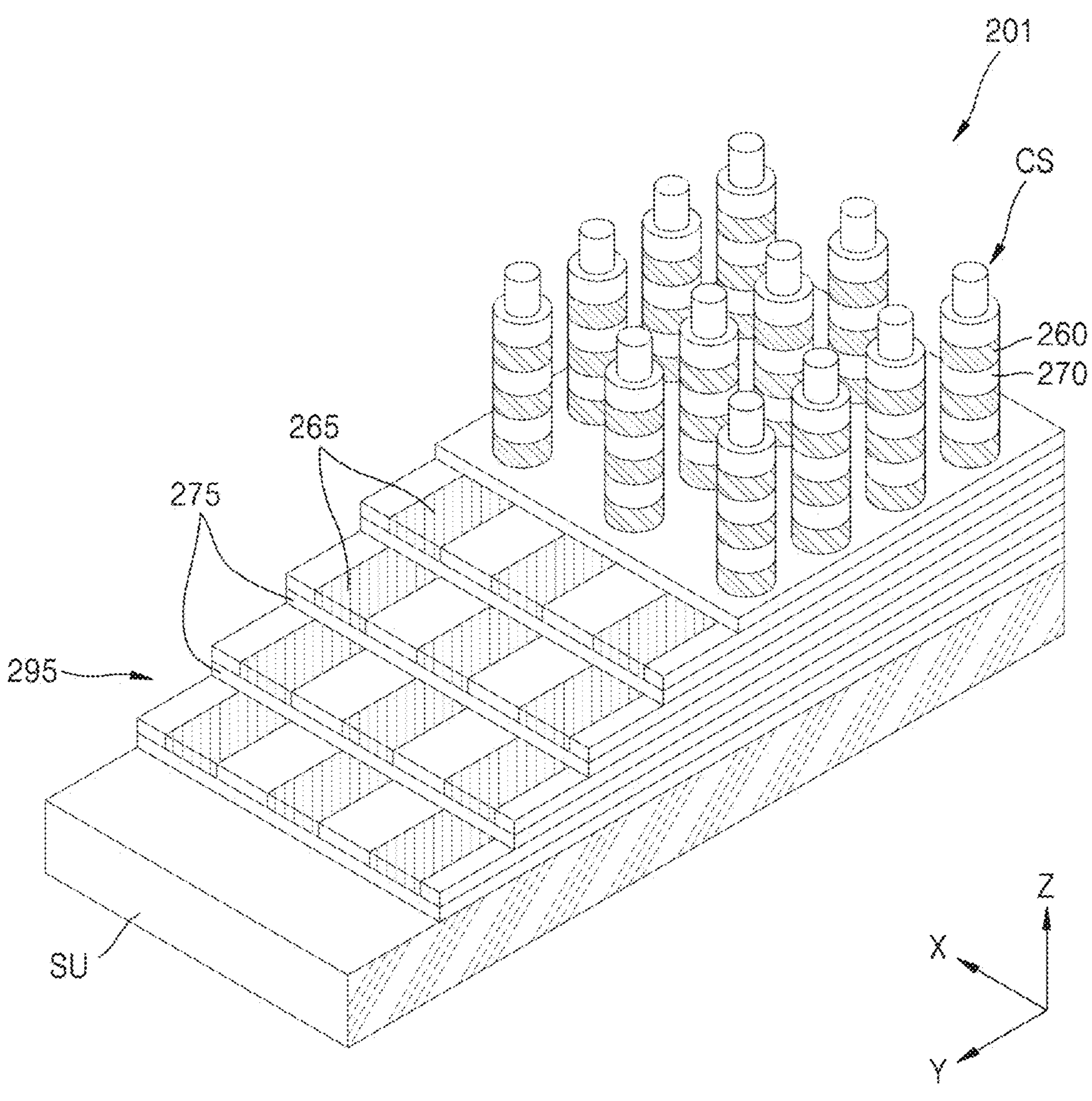
FIG. 9 is a perspective view illustrating a schematic structure of a memory device according to various example embodiments.

FIG. 9 is a perspective view illustrating a blown-up and schematic structure of a memory device according to various example embodiments.

A memory device 201 includes a semiconductor substrate SU and a plurality of memory cell strings CS arranged on the semiconductor substrate SU, and the memory cell strings CS are similar to the memory device 200 described with reference to FIGS. to 8 in view of the feature of extending in a first direction (Z direction) away from the semiconductor substrate SU, and in view of the feature of being two-dimensionally arranged in a second direction and a third direction perpendicular to the first direction.

In some example embodiments, the memory device 201 further includes a stepped wiring structure 295 having wirings 265 extending from each of the gate electrodes 260 of the memory cell string CS to different lengths in the second direction (Y direction) perpendicular to the first direction. Gate electrodes 260 at the same height among the plurality of cell strings CSs arranged along the same row, for example, a row parallel to the Y direction, are connected to the same wiring 265. The length of the wiring 265 extending in the Y direction decreases as the position of the gate electrode 260 increases, forming a stepped arrangement. The insulating layers 275 insulating the adjacent wirings 265 are similarly arranged in a stepped shape. The plurality of wirings 265 illustrated may be connected to different word lines, for example, the word lines WLs illustrated in the circuit diagram of FIG. 7.

In the memory devices 100, 200, and 201 described above, the memory layers 150 and 250 have been described as including a ferroelectric material, but in a memory device of another modified embodiment, the memory layer may include a variable resistance material. The variable resistance material may include an oxide or one or more oxides of one or more of Rb, Ti, Ba, Zr, Ca, Hf, Sr, Sc, B, Mg, Al, K, Y, La, Si, Be, Nb, Ni, Ta, W, V, La, Gd, Cu, Mo, Cr, or Mn. For example, the variable resistance material may include any one of $Rb_2O$, $TiO_2$, BaO, $ZrO_2$, CaO, $HfO_2$, SrO, $Sc_2O_3$, MgO, $Li_2O$, $Al_2O_3$, $SiO_2$, BeO, $Sc_2O_3$, $Nb_2O_5$, NiO, $Ta_2O_5$, $WO_3$, $V_2O_5$, $La_2O_3$, $Gd_2O_3$, CuO, $MoO_3$, $Cr_2O_3$, and $MnO_2$.

The memory layer including the variable resistance material exhibits different resistance characteristics depending on the applied voltage. When the memory layer includes a variable resistance material, in the equivalent circuit of FIGS. 2 and 3, the memory cell MC may be expressed in a form in which a transistor and a variable resistor are connected in parallel. The memory cell selection process for write and/or read is substantially the same as described above. Voltage is applied to the gate electrodes so that the selected memory cell is channel-off and the remaining memory cells are channel-on. In a memory cell in which a channel of a transistor is turned off, an electric field is formed in a memory layer including a variable resistance material, and thus a conductive filament is formed in the variable resistance material and resistance of the memory layer is changed. For example, when oxygen vacancies are collected in the variable resistance material to form conductive filaments, the resistance of the memory layer is lowered. Depending on whether the conductive filament is formed, the memory layer may represent a low resistance state or a high resistance state, and accordingly, information of logical "1" or "0" may be written. Even in the read operation, similarly, read of the selected memory cell may be performed. For example, the gate voltage applied to each gate electrode is adjusted so that the selected memory cell may be channel-off, and the non-selected memory cell is channel-on, and the current flowing through the corresponding cell is measured by the applied voltage Vread between the source electrode S and the drain electrode D, to thus check the cell state of "1" or "0".

FIGS. 10A to 10K are diagrams illustrating a method of manufacturing a memory device, according to various example embodiments.

Figure 10A:
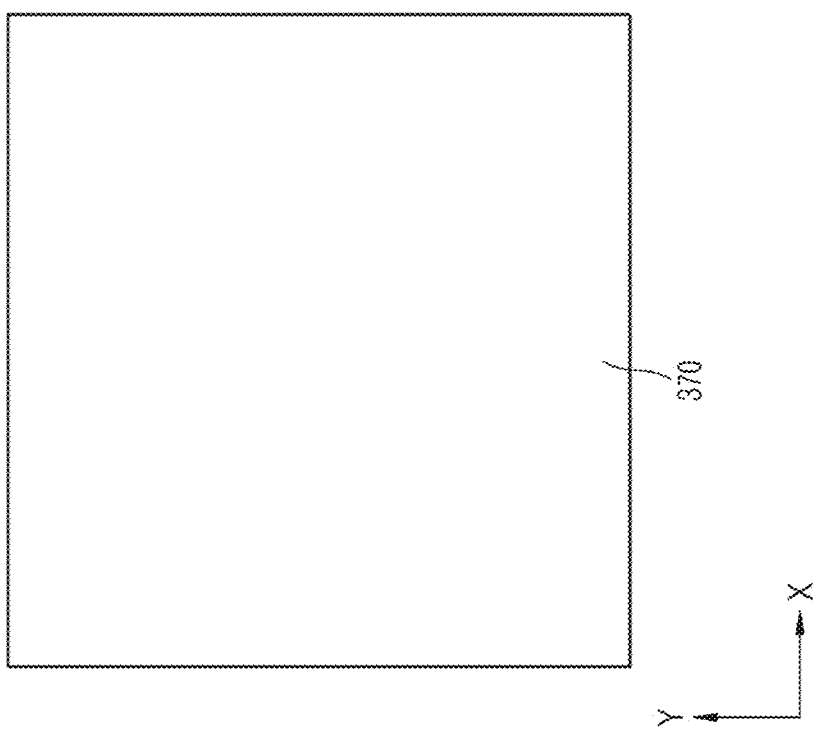
FIGS. 10A to 10K are diagrams illustrating a method of manufacturing a memory device according to various example embodiments.
Figure 10A:
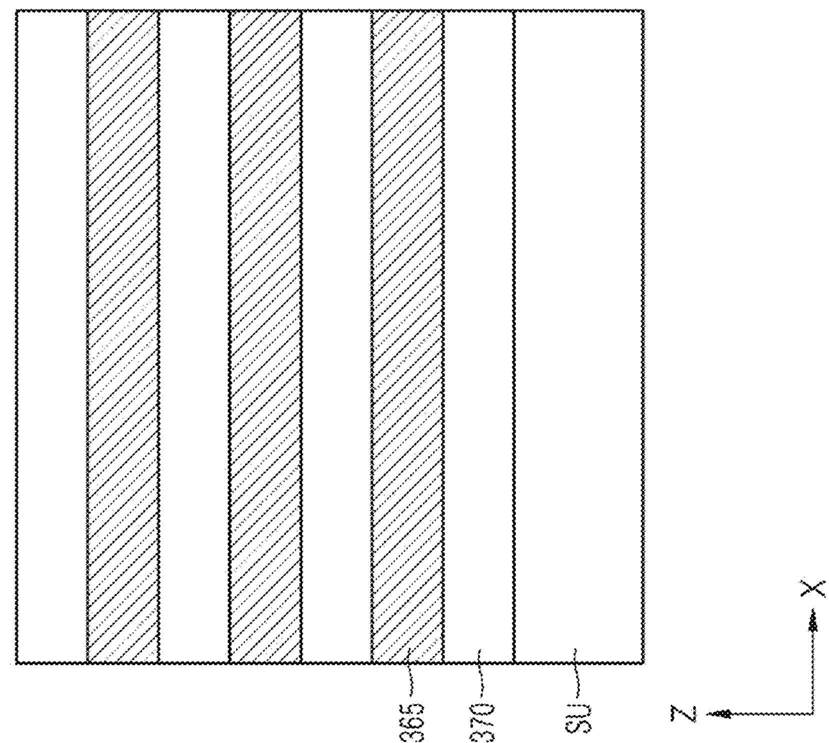

Referring to FIG. 10A, a stack structure in which a first insulating layer 370 and a sacrificial layer 365 are alternately and repeatedly stacked is formed on a semiconductor substrate SU.

The semiconductor substrate SU may be or may include a silicon substrate, for example, a silicon substrate doped with predetermined impurities. The semiconductor substrate SU may be a p-type silicon substrate, but is not limited thereto.

The first insulating layer 370 is made of an insulating material, and may include, for example, SiO, SiOC, or SiON.

The sacrificial layer 365 is a layer for forming a recess structure for forming a channel layer and a memory layer having a shape as described above, and is formed of a material having a different etching ratio from that of the first insulating layer 370. The sacrificial layer 365 may include, for example, SiNx.

The thickness of the first insulating layer 370 and the thickness of the sacrificial layer 365 may be the same as each other or may be different from one another, and may be determined according to a detailed structure of a memory device to be manufactured, for example, a gap between gate electrodes of the memory device to be manufactured. The thickness of the sacrificial layer 365 may range from about 20 nm to about 100 nm. The thickness of the first insulating layer 370 may be formed in a range of about 10 nm to about 100 nm. The thickness of each sacrificial layer 365 may be the same, or may be different from one another. The thickness of each first insulating layer 370 may be the same, or may be different from one another.

A gate electrode is formed at a position of the sacrificial layer 365, for example, the number of sacrificial layers 365 corresponds to the number of unit cells of the memory device to be manufactured.

In order to form the first insulating layer 370 and the sacrificial layer 365, a deposition method, such as one or more of an atomic layer deposition (ALD), metal organic atomic layer deposition (MOALD), chemical vapor deposition (CVD), metal organic chemical vapor deposition (MOCVD), physical vapor deposition (PVD) or the like, may be used. The deposition methods include placing the semiconductor substrate SU in a chamber, heating the chamber to a predetermined or dynamically determined temperature, and supplying a source, and process conditions, such as a temperature and/or a time, are adjusted according to a desired thickness.

Figure 10B:
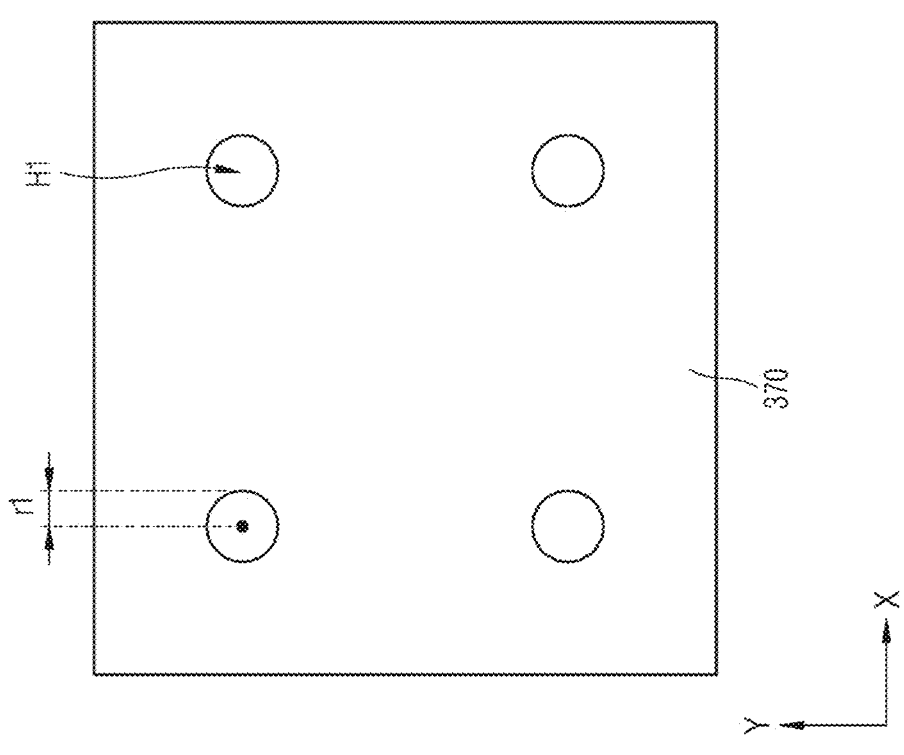
Figure 10B:
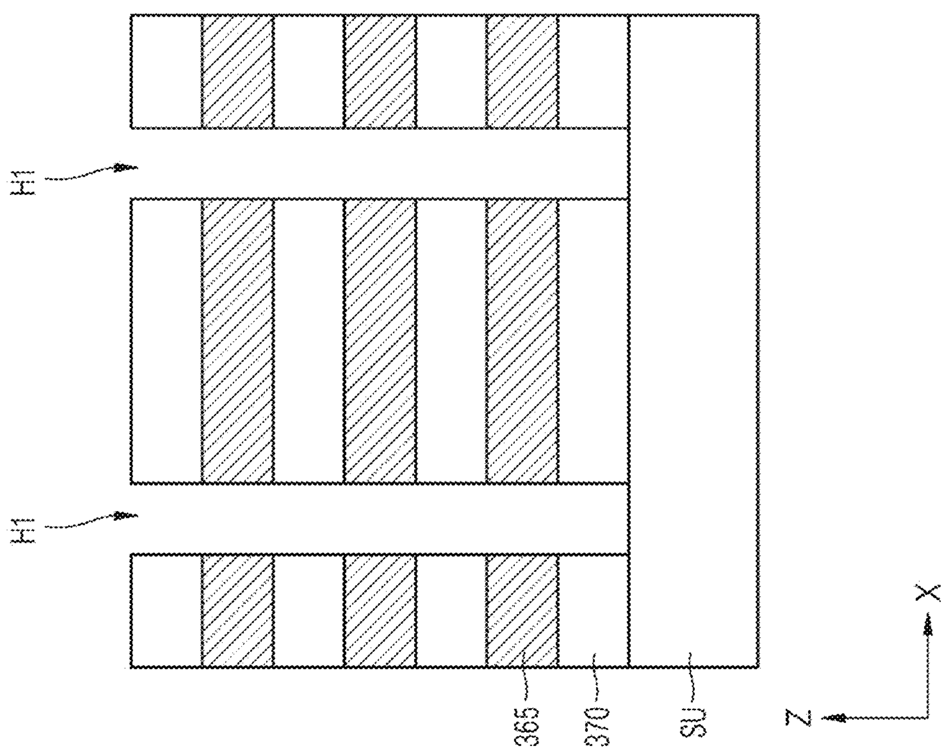
Figure 10C:
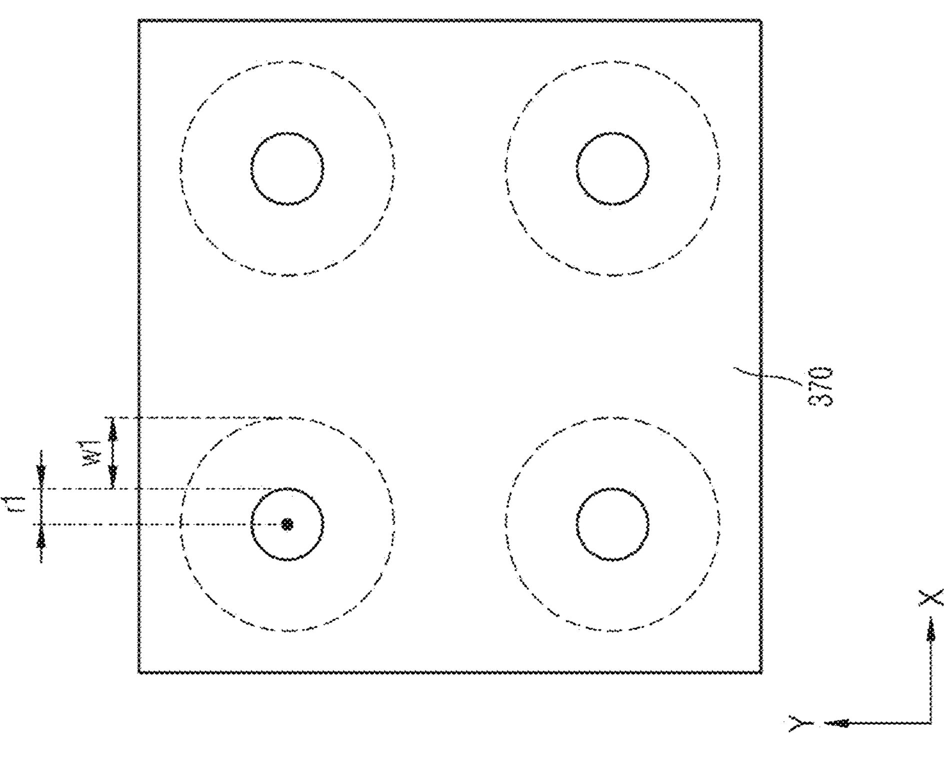
Figure 10C:
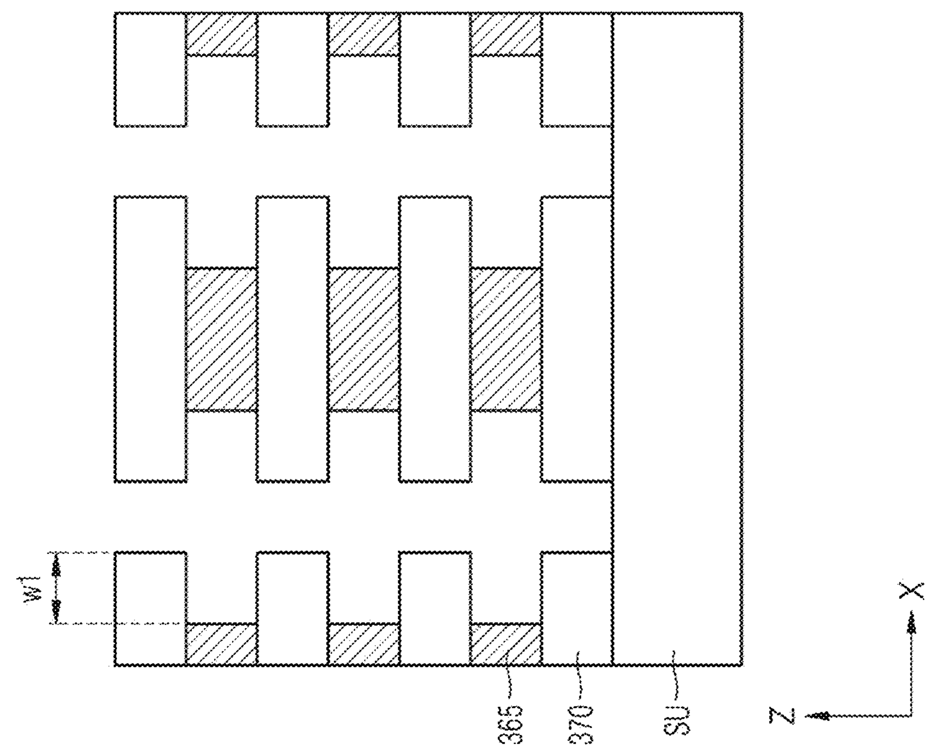

Referring to FIG. 10B, holes H1 are formed in the stacked structure formed as shown in FIG. 10A. The holes H1 are or correspond to holes for forming a recess structure in the sacrificial layer 365, forming the memory layer and the channel layer. A photolithography and an etching process may be used to form the holes H1. The number of holes H1 is shown as two, but this is an example. For example, the holes H1 may be formed as many as the number of memory cell strings CSs described with reference to FIGS. 5A to 7. The hole H1 may have a cylindrical shape. The radius r1 of the hole H1 may be determined considering a shape dimension of a structure to be finally formed. For example, adding the thickness (X direction) of the memory layer to r1 may result in r illustrated in FIG. 5B. The holes H may be formed with an etching process such as an anisotropic etching process such as a reactive ion etching (RIE) process; however, example embodiments are not limited thereto.

Next, referring to 10C, the sacrificial layer 365 is partially etched to process the inner surface of the hole H1 in an uneven shape. As a process of selectively etching the sacrificial layer 365 among the sacrificial layer 365 and the first insulating layer 370 having different etching ratios, a wet etching method using an etching solution of etching the sacrificial layer 365 and not etching the first insulating layer 370 may be used. Alternatively or additionally, an etching solution for etching the sacrificial layer 365 and the first insulating layer 370 at different ratios may be used. However, various example embodiments are not limited thereto. The length of the unevenness, for example, the length w1 in which the sacrificial layer 365 is introduced from the first insulating layer 370 in a direction (X direction) perpendicular to the stacking direction (Z direction), may be determined considering a shape dimension of a final structure, for example, the length of the memory region 250*a* shown in FIG. 5B in the X direction. For example, a memory region 250*a* and a second insulating layer 330 may be formed in a space having an introduced length w1. An etching solution and an etching time may be set so as to be etched by a desired length. w1 may be approximately 20 nm or more to 300 nm or less.

Figure 10D:
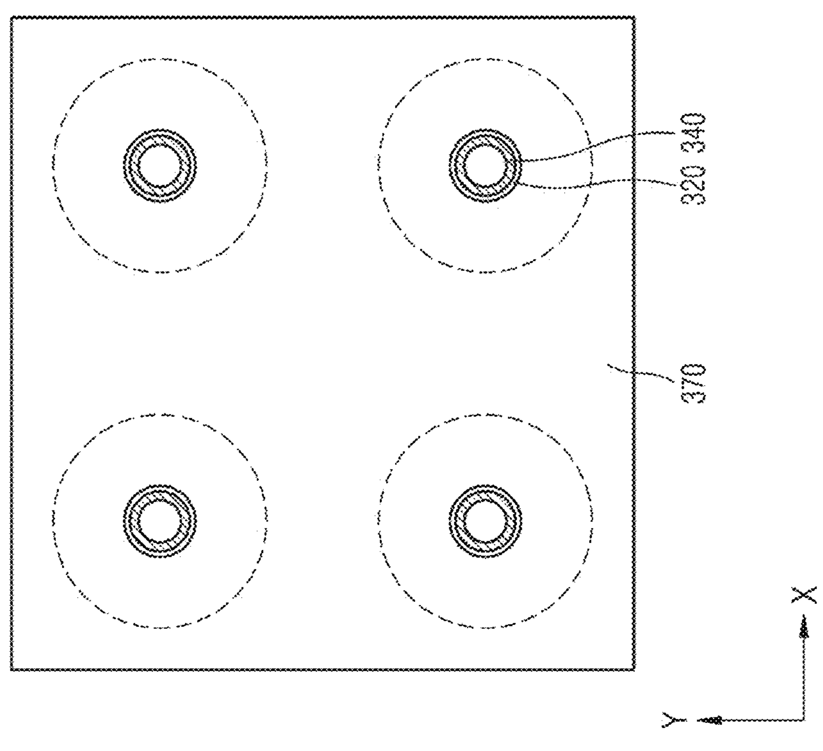
Figure 10D:
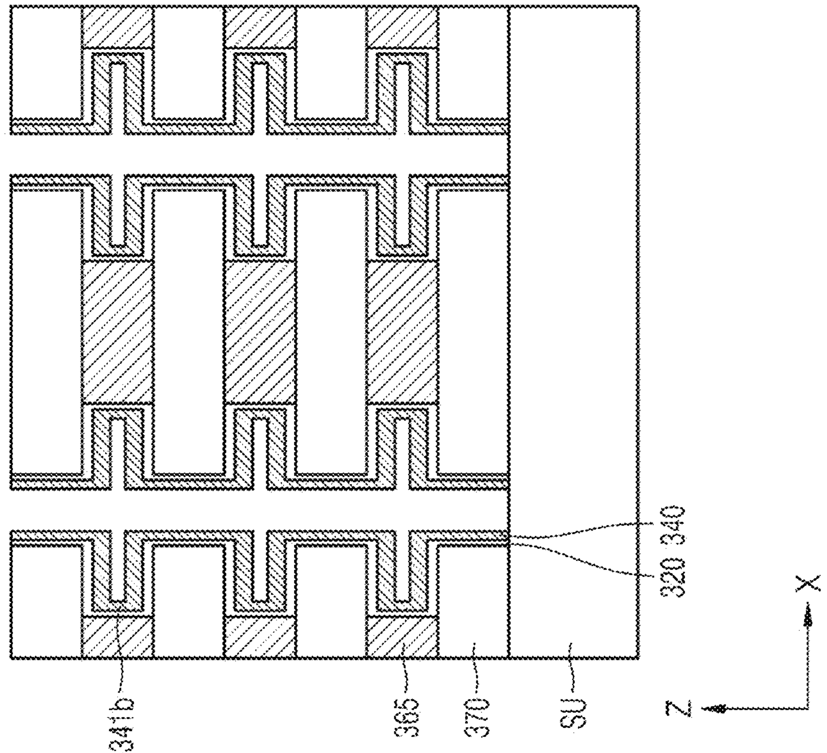

Next, referring to FIG. 10D, a gate insulating layer 320 and a channel layer 340 are sequentially formed on an inner surface of the hole H1.

The gate insulating layer 320 may be formed of various insulating materials, such as silicon oxide, silicon nitride, or silicon oxynitride. The channel layer 340 may be formed of a semiconductor material, and may include, for example, poly-Si. The channel layer 340 may be doped with a predetermined dopant, and may be doped p-type as the semiconductor substrate SU. However, various example embodiments are not limited thereto. The channel layer 340 may include, for example, various materials of the channel layer 140 of FIG. 1. The region of the channel layer 340 includes regions described with reference to FIG. 5B, although a detailed display is omitted. Among the regions of the channel layer 340, a region other than a region 341*b* facing the sacrificial layer 365 in the drawing and serving as a channel of the transistor, may have higher conductivity than the region 341*b*. For example, doping concentrations of the channel layer 340 may be different from each other in the region 341*b* and other regions. For example, the doping concentration of the region 341*b* may be lower than those of other regions. Alternatively or additionally, the material described above of the channel layer 340 may be applied only to the region 341*b* serving as a channel of the transistor TR, and another region may include another conductive material having higher conductivity.

In order to form the gate insulating layer 320 and the channel layer 340, a deposition method, such as one or more of atomic layer deposition (ALD), metal organic atomic layer deposition (MOALD), chemical vapor deposition (CVD), metal organic chemical vapor deposition (MOCVD), physical vapor deposition (PVD) or the like, may be used. The deposition methods include processes of placing a stack structure to form the gate insulating layer 320 and the channel layer 340 in a chamber, heating the chamber to a predetermined or dynamically determined temperature, and supplying a source, and process conditions such as temperature and time are adjusted according to a desired thickness.

Figure 10E:
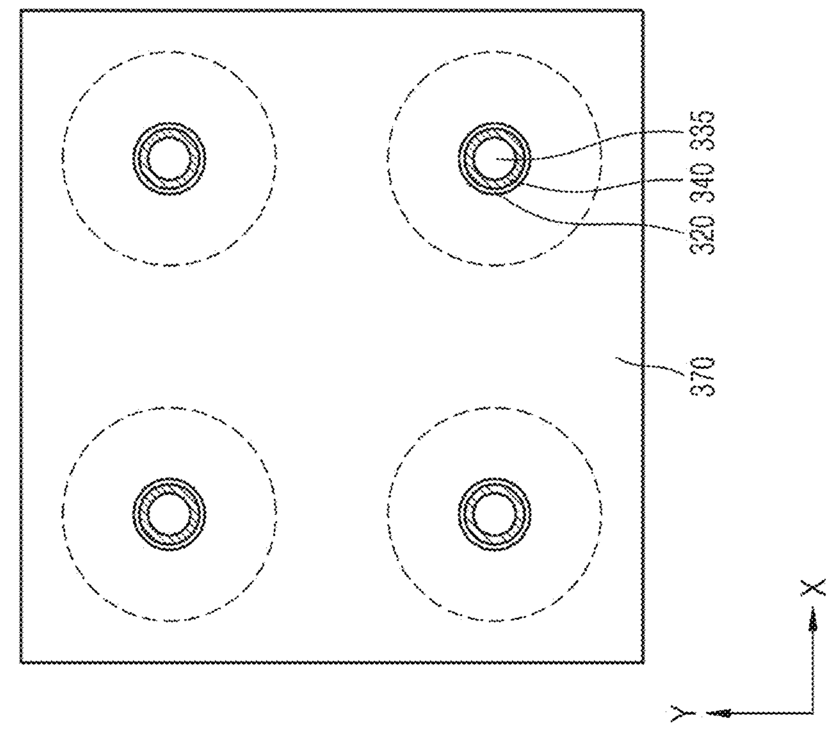
Figure 10E:
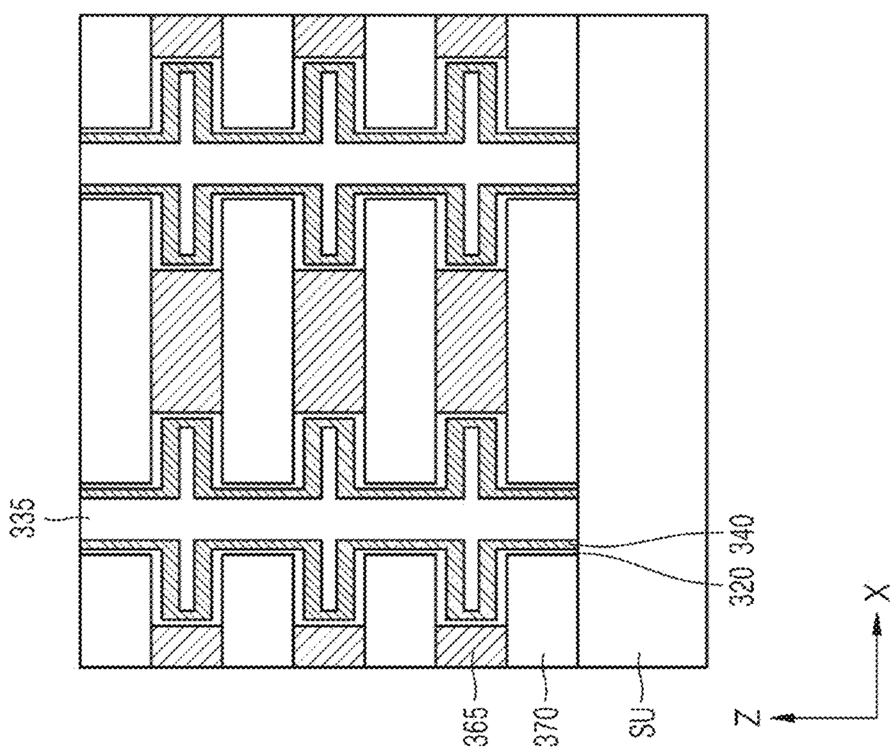

Next, referring to FIG. 10E, the interior of the hole H1 is filled with the insulating material 335. The insulating material 335 may include one or more of SiO, SiOC, SiN, or various other oxides.

Figure 10F:
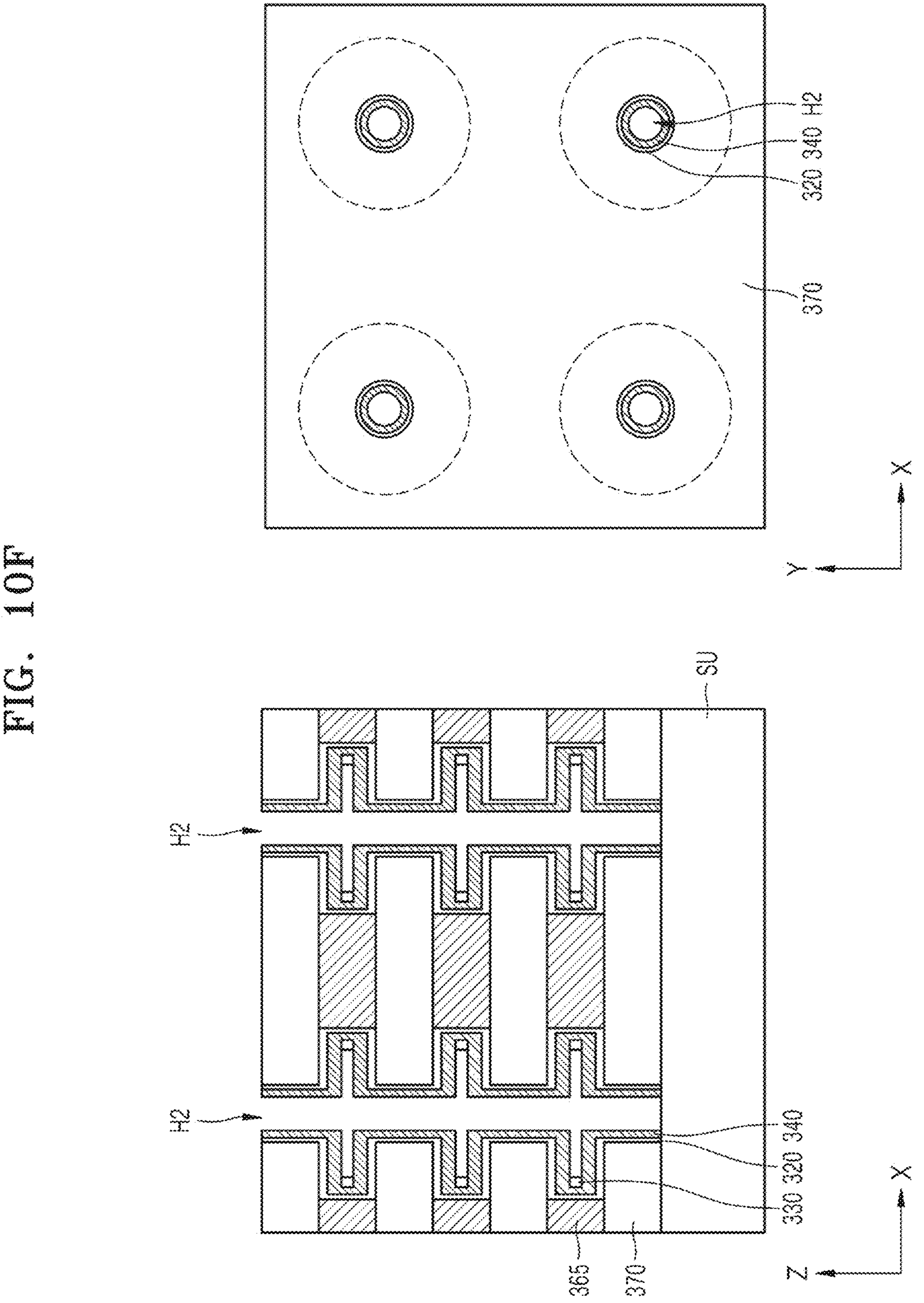

Referring to FIG. 10F, a recess process is performed to form a hole H2. The operation of FIG. 10F is a process of removing the insulating material 335 formed in the operation of FIG. 10E, and all of the insulating materials 335 are not removed, but some of the insulating materials remain to become the second insulating layer 330. As described in the description of the second insulating layer 130 of FIG. 1, the second insulating layer 330 serves as a separator between the transistor and the memory layer. The second insulating layer 330 may not be formed. In this case, the operations of FIGS. 10E and 10F may be omitted.

Figure 10G:
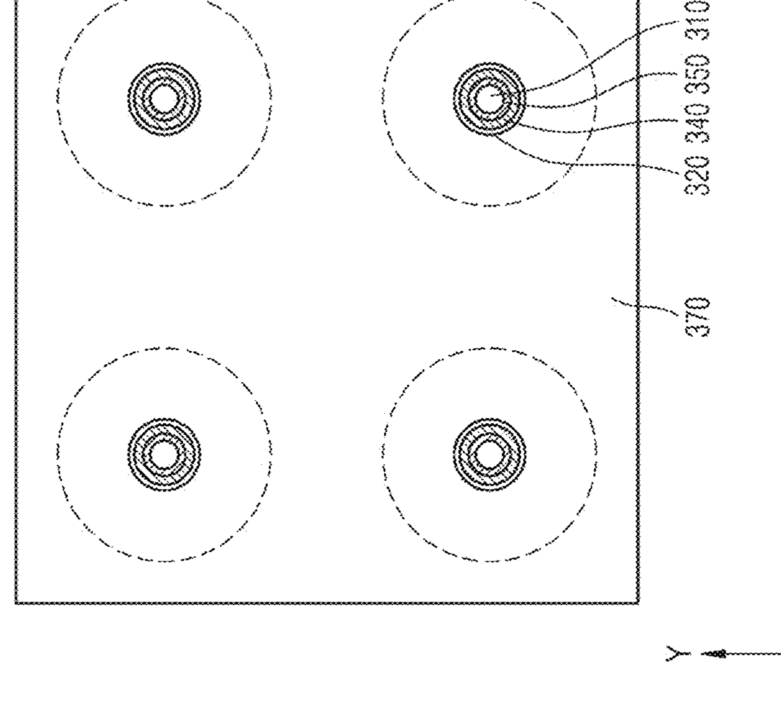

Referring to FIG. 10G, a memory layer 350 is formed along a side surface of the hole H2, that is, a surface of the channel layer 340.

The memory layer 350 may include a ferroelectric material, or may include a variable resistance material.

The ferroelectrics may include at least one or more materials selected from the group consisting of or the group including hafnium oxide ($HfO_2$), zirconium oxide ($ZrO_2$), hafnium-zirconium oxide ($Haf_xZr_{1-x}O_2$, where 0<x<1), and a combination thereof. The ferroelectrics may include at least one or more materials selected from the group consisting of or the group including hafnium oxide ($HfO_2$), zirconium oxide ($ZrO_2$), hafnium-zirconium oxide ($Hf_xZr_{1-x}O_2$, where 0<x<1), as a base material, and may further include at least one or more materials selected from the group consisting of or the group including C, Si, Ge, Sn, Pb, Al, Y, La, Gd, Mg, Ca, Sr, Ba, Ti, Zr, Hf and a combination thereof, as a dopant material. In addition, the ferroelectrics may include all materials based on HfO having a Fluorite structure, nitride-based ferroelectrics, such as AlScN, and perovskite-structured ferroelectrics, such as PZT, SBT, and BTO.

The variable resistance material may include an oxide of or more than one oxides of Rb, Ti, Ba, Zr, Ca, Hf, Sr, Sc, B, Mg, Al, K, Y, La, Si, Be, Nb, Ni, Ta, W, V, La, Gd, Cu, Mo, Cr, or Mn. For example, the variable resistance material may include any one of or more than one of $Rb_2O$, $TiO_2$, BaO, $ZrO_2$, CaO, $HfO_2$, SrO, $Sc_2O_3$, MgO, $Li_2O$, $Al_2O_3$, $SiO_2$, BeO, $Sc_2O_3$, $Nb_2O_5$, NiO, $Ta_2O_5$, $WO_3$, $V_2O_5$, $La_2O_3$, $Gd_2O_3$, CuO, $MoO_3$, $Cr_2O_3$, and $MnO_2$.

In order to form the channel 340 and the memory layer 350, a deposition method, such as one or more of atomic layer deposition (ALD), metal organic atomic layer deposition (MOALD), chemical vapor deposition (CVD), metal organic chemical vapor deposition (MOCVD), physical vapor deposition (PVD) or the like, may be used. The deposition methods include processes of placing a stack structure to form the channel layer 340 and the memory layer 350 in a chamber, heating the chamber to a predetermined temperature, and supplying a source, and process conditions such as temperature and time are adjusted according to a desired thickness.

Referring to FIG. 10G, the remaining space of the hole H2 is filled with an insulating material to form an insulating structure 310.

Figure 10H:
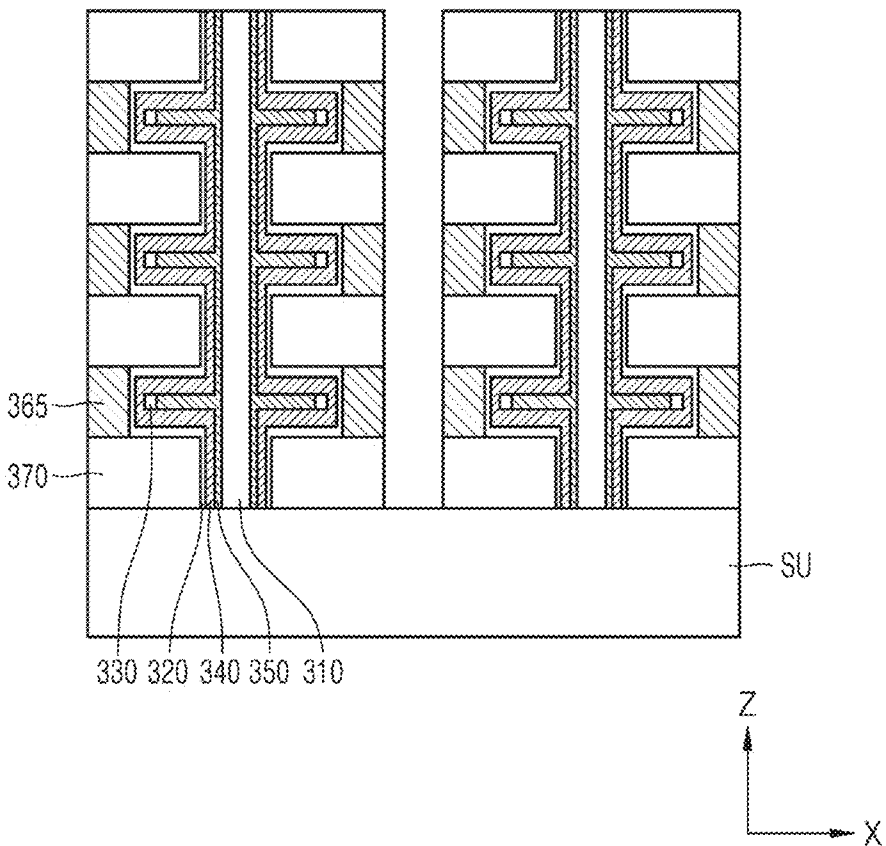

Referring to FIG. 10H, the structure of FIG. 10G is etched and cut.

Figure 10I:
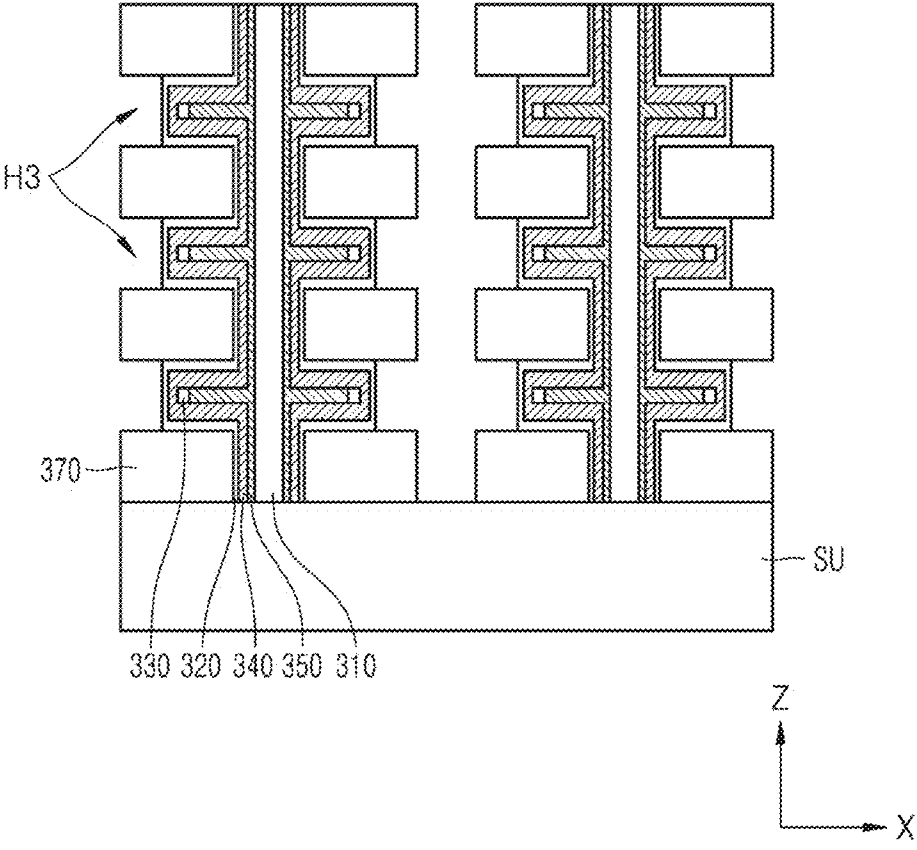

Referring to FIG. 10I, the remaining sacrificial layer 365 is removed to form a plurality of holes H3.

Figure 10J:
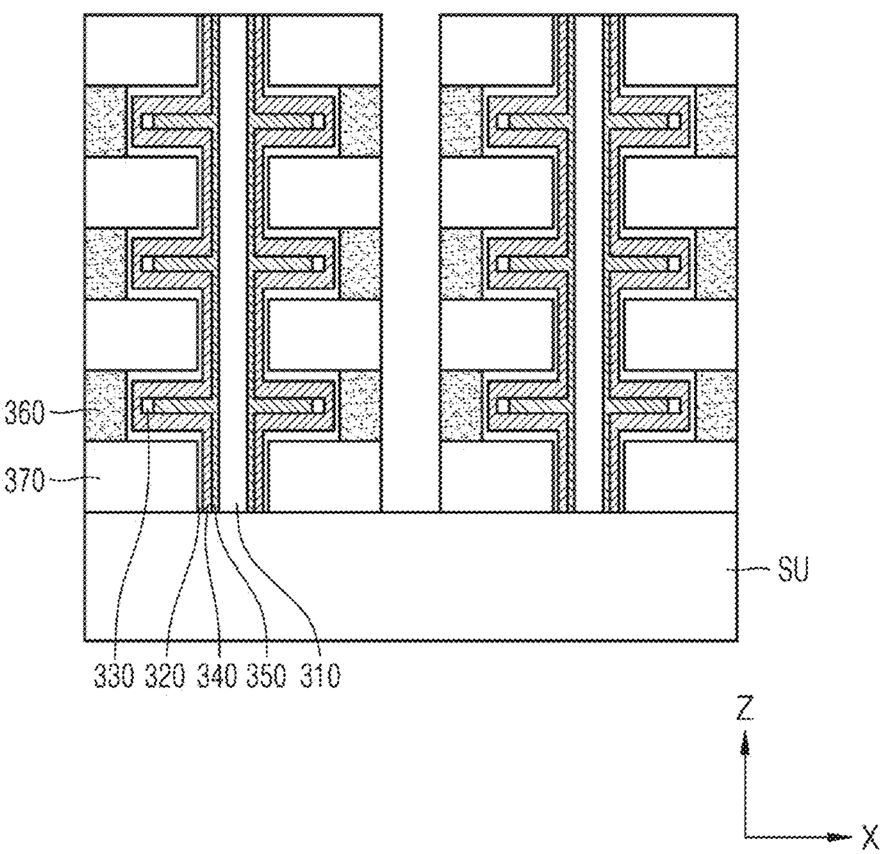

Referring to FIG. 10J, when an electrode material is deposited in the plurality of holes H3, and thus the gate electrode 360 is formed, the two memory cell strings similar to those described with reference to FIG. 8A are formed.

Figure 10K:
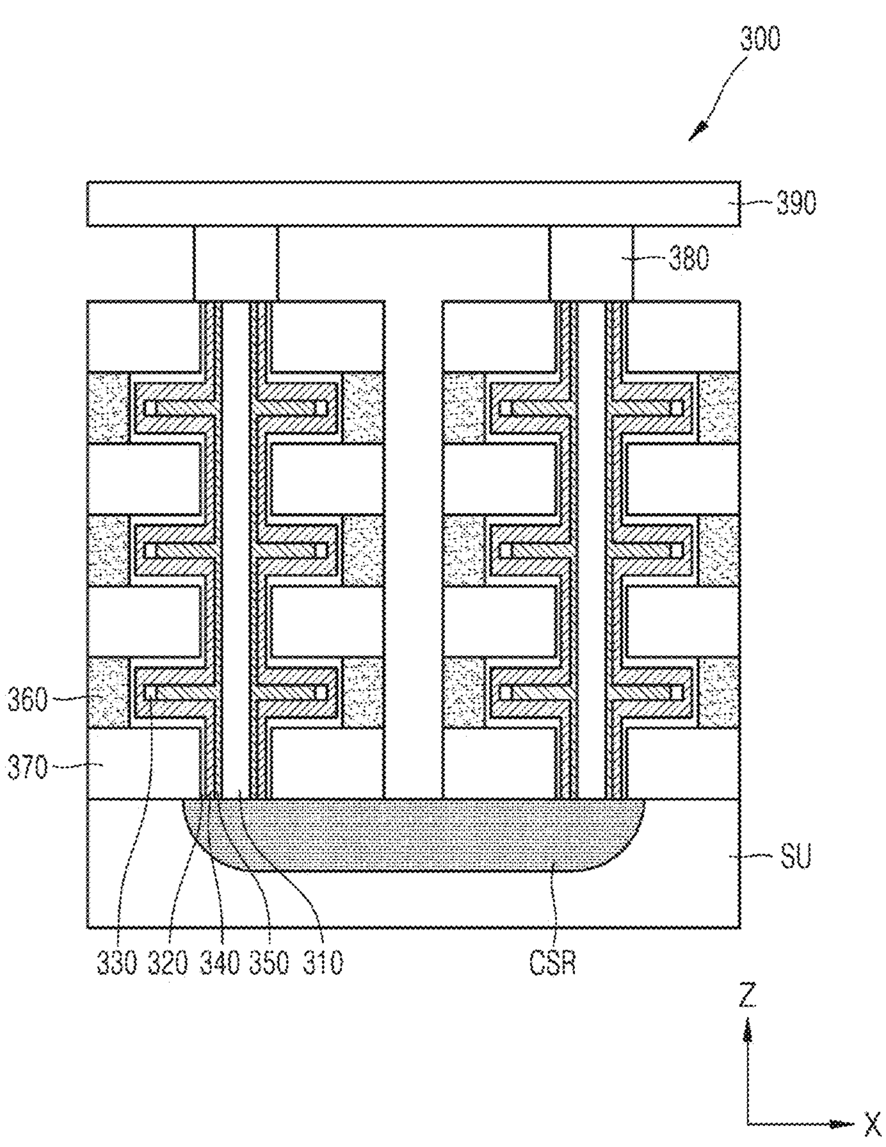

Next, as shown in FIG. 10K, a common source region CSR, a drain region 380 and a bit line 390 are formed.

A high-concentration region formed by injecting a dopant into a predetermined region on the semiconductor substrate SU is a common source region CSR, and the channel layer 340 is formed to contact the common source region CSR.

The channel layer 340 forms a drain region 380 connected to one end facing the other end contacting the common source region CSR and forms a bit line 390 connecting the drain region 380.

As described above, the memory device 300 having a structure similar to that described with reference to FIGS. 5A to 8 may be provided. The above-described manufacturing method is an example description, and the memory device 300 may be formed using another modified manufacturing method.

The memory devices 100, 200, 201, and 300 according to various example embodiments may be employed as a memory system of various electronic devices. The memory devices 100, 200, 201, and 300 may be implemented as chip-shaped memory blocks to be used as a neuromorphic computing platform, and/or may be used to configure a neural network.

Figure 11:
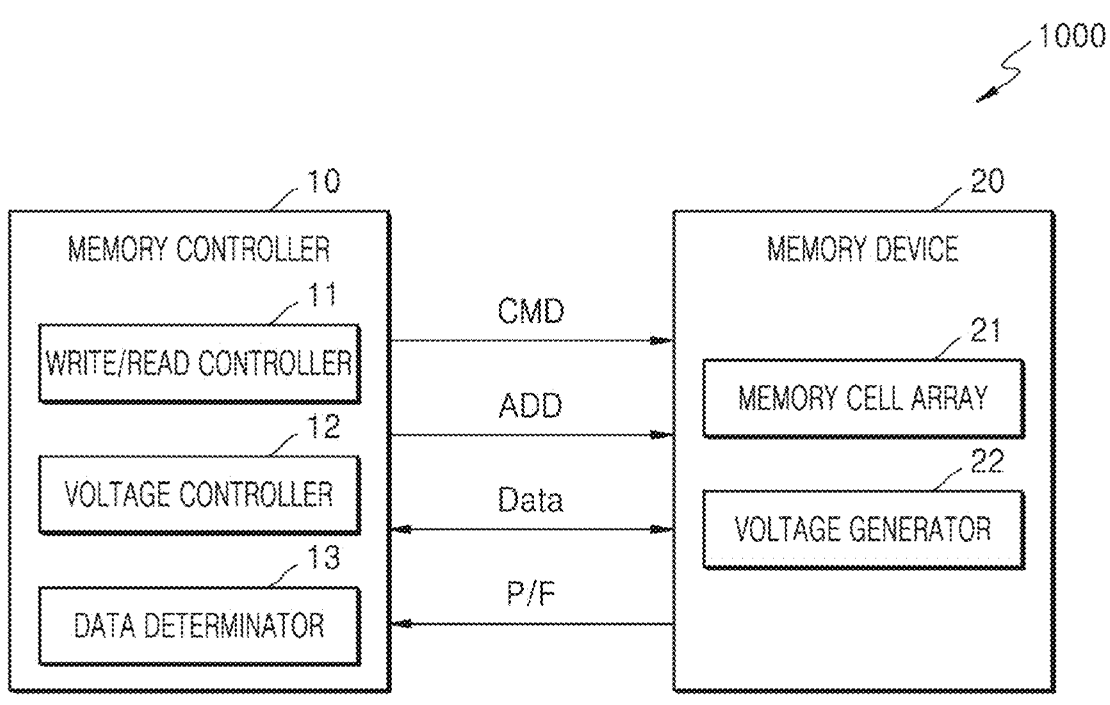
FIG. 11 is a block diagram schematically illustrating a structure of a memory system according to various example embodiments.

FIG. 11 is a block diagram illustrating a memory system according to various example embodiments. Referring to FIG. 11, the memory system 1000 may include a memory controller 10 and a memory device 20. The memory controller 10 performs a control operation on the memory device 20, and for example, the memory controller may provide an address ADD and a command CMD to the memory device 20 to perform a program (or write), read, and erase operations on the memory device 20. Alternatively or additionally, data for a program operation and read data may be transmitted and received between the memory controller 10 and the memory device 20.

The memory device 20 may include a memory cell array 21 and a voltage generator 22. The memory cell array 21 may include a plurality of memory cells arranged in regions where a plurality of word lines and a plurality of bit lines intersect. The memory cell array 21 may include flash memory cells implemented in various forms with nonvolatile memory cells that store data nonvolatilely. The memory cell array 21 may include the memory device 100, 200, 201, or 300 described above, and/or a memory device having a modified structure therefrom.

The memory controller 10 may include a write/read controller 11, a voltage controller 12, and a data determinator 13.

The write/read controller 11 may generate an address ADD and a command CMD for performing program/read and erase operations on the memory cell array 21. In addition, the voltage controller 12 may generate a voltage control signal to control at least one voltage level used in the nonvolatile memory device 20. For example, the voltage controller 12 may read data from the memory cell array 21 or generate a voltage control signal for controlling a voltage level of a word line for programming data to the memory cell array 21.

The data determinator 13 may perform a determination operation on data read from the memory device 20. For example, data read from memory cells may be determined to determine the number of on-cells and/or the number of off-cells from among the memory cells. The memory device 20 may provide a pass/fail signal P/F to the memory controller 10 according to a read result of the read data. The data determinator 13 may control write and read operations of the memory cell array 21 with reference to the pass/fail signal P/F. As an example of operation, when a program is performed for a plurality of memory cells, it is determined whether a program is normally completed for all cells by determining the state of data of the memory cells using a predetermined read voltage.

Figure 12:
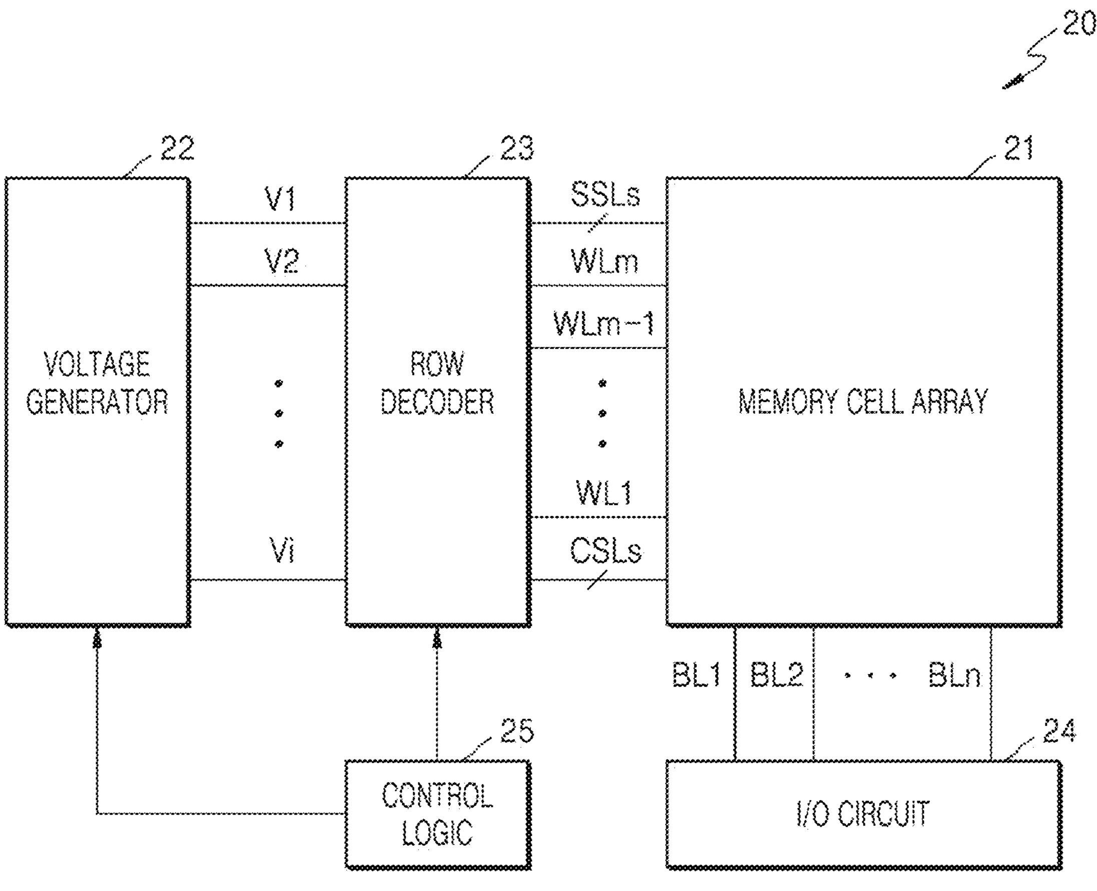
FIG. 12 is a block diagram illustrating an implementation example of a memory device provided in the memory system of FIG. 11.

FIG. 12 is a block diagram illustrating various example embodiments of a memory device 200 included in the memory system 1000 of FIG. 11. Referring to FIG. 12, the memory device 20 may further include a row decoder 23, an input/output circuit 24, and a control logic 25.

The memory cell array 21 may be connected to one or more string selection lines SSLs, a plurality of word lines WL1 to WLm, and one or more common source lines CSLs, and may also be connected to a plurality of bit lines BL1 to BLn. The voltage generator 22 may generate one or more word line voltages V1 to Vi, and the word line voltages V1 to Vi may be provided to the row decoder 23. The signals for program/read/erase operations may be applied to the memory cell array 21 through the bit lines BL1 to BLn.

In addition, data to be programmed may be provided to the memory cell array 21 through the input/output (I/O) circuit 24, and the read data may be provided to the outside (e.g., a memory controller) through the I/O circuit 24. The control logic 25 may provide various control signals related to the memory operation to the row decoder 23 and the voltage generator 22.

According to the decoding operation of the row decoder 23, the word line voltages V1 to Vi may be provided to various lines SSLs, WL1 to WLm, and CSLs. For example, the word line voltages V1 to Vi may include a string selection voltage, a word line voltage, and a ground selection voltage. The string selection voltage may be provided to one or more string selection lines SSLs, the word line voltage may be provided to one or more word lines WL1 to WLm, and the ground selection voltage may be provided to one or more common source lines CSLs.

Figure 13:
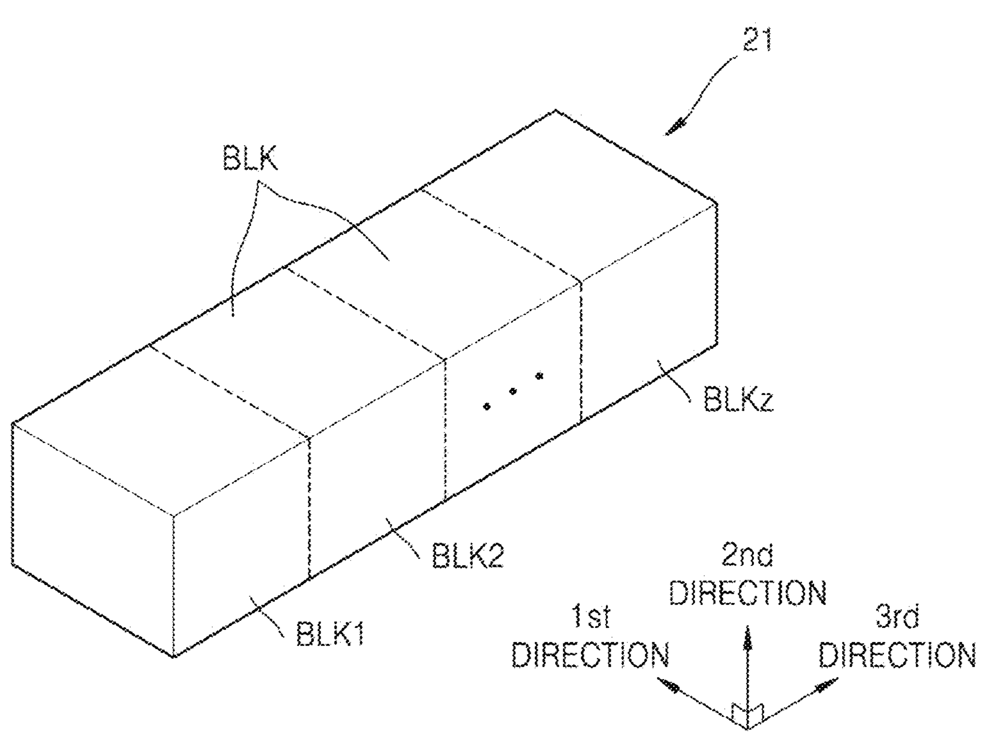
FIG. 13 is a perspective view illustrating a memory cell array provided in the memory system of FIG. 11.

FIG. 13 is a perspective view illustrating a memory cell array 21 provided in the memory system 1000 of FIG. 11. Referring to FIG. 13, the memory cell array 21 includes a plurality of memory blocks BLK1 to BLKz. Each memory block BLK has a three-dimensional structure (or vertical structure). For example, each memory block BLK may include structures extending in first to third directions. For example, each memory block BLK may include a plurality of memory cell strings extending in the second direction. In addition, the plurality of memory cell strings may be two-dimensionally arranged in the first and third directions. Each memory cell string is connected to a bit line BL, a string selection line SSL, a word line WL, and a common source line CSL. Accordingly, each of the memory blocks BLK1 to BLKz may be connected to a plurality of bit lines BLs, a plurality of string selection lines SSLs, a plurality of word lines WLs, and a plurality of common source lines CSLs. The memory blocks BLK1 to BLKz may be configured to have an equivalent circuit illustrated in FIG. 7.

Figure 14:
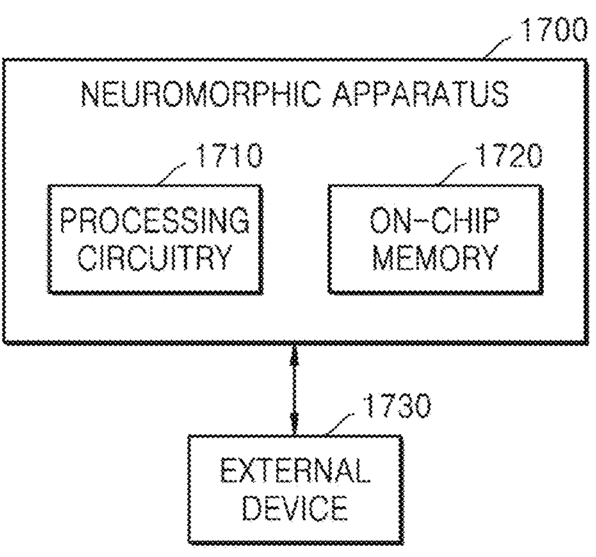
FIG. 14 is a block diagram illustrating a neuromorphic apparatus and an external device connected thereto according to various example embodiments.

FIG. 14 is a block diagram illustrating a neuromorphic apparatus and an external device connected thereto according to various example embodiments.

Referring to FIG. 14, the neuromorphic apparatus 1700 may include a processing circuitry 1710 and/or an on-chip memory 1720. The neuromorphic apparatus 1700 may include the memory device 100, 200, 201, or 300 described above.

In some example embodiments, the processing circuitry 1710 may be configured to control a function for driving the neuromorphic apparatus 1700. For example, the processing circuitry 1710 may be configured to control the neuromorphic apparatus by executing a program stored in the on-chip memory 1720. In some example embodiments, the processing circuitry may include hardware such as a logic circuit, a hardware/software combination such as a processor executing software, or a combination thereof. For example, the processor may include, but is not limited to, a central processing unit (CPU), a graphics processing unit (GPU), an application processor (AP) included in the neuromorphic apparatus 1700, an arithmetic logic unit (ALU), a digital signal processor, a microcomputer, a field programmable gate array (FPGA), a system-on-chip (SoC), a programmable logic unit, a microprocessor, an application-specific integrated circuit (ASIC), or the like. In some example embodiments, the processing circuitry 1710 may be configured to read/write various data with respect to an external device 1730, and/or to execute the neuromorphic apparatus 1700 using the read/written data. In some embodiments, the external device 1730 may include an external memory and/or a sensor array having an image sensor (e.g., a CMOS image sensor circuit).

In some example embodiments, the neuromorphic apparatus of FIG. 14 may be applied to a machine learning system. Machine learning systems may use various artificial network neural network structure and processing model such as convolutional neural networks (CNNs), deconvolutional neural networks, long short-term memory (LSTM) units, and/or recurrent neural networks (RNNs) selectively including gated recurrent units (GRUs), stacked neural networks (SNNs), state-space dynamic neural networks (SSDNNs), deep faith networks (DBNs), generative adversarial networks (GANs), and limited Boltzmann machines (RPMs).

Alternatively or additionally, these machine learning systems may include other forms of machine learning models, for example, linear and/or logistic regression, statistical clustering, Bayesian classification, decision trees, dimensional reduction such as principal component analysis, expert systems, and/or random forests or a combination thereof. These machine learning models may be used to provide a variety of services and/or applications, for example, image classification services, biometric or biometric data-based user authentication services, Advanced Driver Assistance System (ADAS) services, voice assistant services, and automatic voice recognition (ASR) services may be executed by an electronic device.

Figure 15:
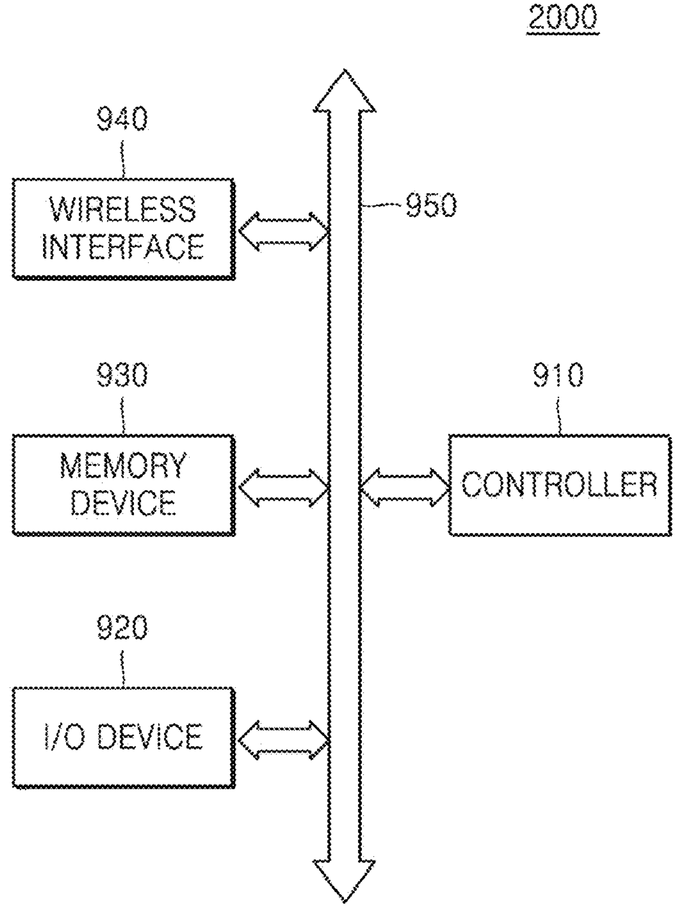
FIG. 15 is a block diagram illustrating an electronic device according to various example embodiments.

FIG. 15 is a block diagram illustrating an electronic device according to various example embodiments.

The electronic device 2000 may include, but is not limited to, a PDA, a laptop (or notebook) computer, a portable computer, a web tablet, a wireless phone, a mobile phone, a digital music player, a wired/wireless electronic device, and the like. The electronic device 2000 may include a controller 910, an input/output device 920 (e.g., a keypad, a keyboard, and/or a display), a memory device 930, and a wireless interface 940, connected to each other through bus 950. The controller 910 may be implemented as a hardware-like processing circuitry including a logic circuit, a hardware/software combination such as processor execution software, or a combination thereof. For example, the processing circuitry may include, but is not limited to, central processing units (CPUs), microprocessors, digital signal processors, microcontrollers, or other logic devices. Other logic devices may have functions similar to any one of a microprocessor, a digital signal processor, and a microcontroller. The memory device 930 may store, for example, a command executed by the controller 910. In addition, the memory device 930 may also be used to store user data.

The memory device 930 includes a plurality of memory cells. The memory device 930 may include the memory device 100, 200, 201, or 300 described above, or a memory device having a modified structure therefrom.

The electronic device 2000 may use the wireless interface 940 to transmit data to or receive data from the wireless communication network communicating with a radio frequency (RF) signal. For example, the wireless interface 940 may include an antenna or a wireless transceiver. The electronic device 2000 may be used for communication interface protocols such as third-generation communication systems (e.g., one or more of CDMA, GSM, NADC, E-TDMA, WCDAM, and/or CDMA2000).

The above-described memory device has a memory cell structure advantageous for expanding into a three-dimensional array.

The above-described memory device may have a high memory density.

The above-described memory device may be utilized in various electronic devices.

It should be understood that various example embodiments described herein should be considered in a descriptive sense only and not for purposes of limitation. Descriptions of features or aspects within each embodiment should typically be considered as available for other similar features or aspects in other embodiments. While one or more example embodiments have been described with reference to the figures, it will be understood by those of ordinary skill in the art that various changes in form and details may be made therein without departing from the spirit and scope as defined by the following claims.

What is claimed is:

1. A memory device comprising:

a plurality of gate electrodes spaced apart from each other in a first direction;

a memory layer comprising a plurality of memory regions that protrude in a second direction and extend in the second direction that is perpendicular to the first direction to face the plurality of gate electrodes, respectively;

a plurality of first insulating layers extended to spaces between the plurality of memory regions between the plurality of gate electrodes;

a channel layer between the memory layer and the plurality of gate electrodes, the channel layer having a shape including a plurality of first regions surrounding the plurality of memory regions and a second region that connects the plurality of first regions to each other in the first direction;

a gate insulating layer between the channel layer and the plurality of gate electrodes, wherein the plurality of first regions comprise a first part and a third part facing each other with the plurality of memory regions between the first part and the third part, and a second part arranged between the first part and the third part and facing the plurality of gate electrodes, both of the first part and the third part have a higher conductivity than the second part and the first part and the third part of the channel layer serve as electrodes of a capacitor, and the second part serves as a channel of a transistor.

2. The memory device of claim 1, wherein an area in which each of the first part and the third part faces one of the plurality of memory regions is 0.003 $\mu m^2$ (square microns) or more and 0.025 $\mu m^2$ (square microns) or less.

3. The memory device of claim 1, further comprising:

a second insulating layer positioned between one of the plurality of memory regions and the second part.

4. The memory device of claim 3, wherein the second insulating layer comprises one or more of SiO, SiOC, or SiN, or defines an air gap.

5. The memory device of claim 1, wherein a protruding length of the plurality of memory regions is 10 nm or more to 100 nm or less.

6. The memory device of claim 1, wherein a length of the plurality of gate electrodes in the first direction is 20 nm or more to 100 nm or less.

7. The memory device of claim 1, wherein the memory layer comprises a ferroelectric material.

8. The memory device of claim 7, wherein the memory layer comprises at least one of an oxide of Hf, an oxide of Zr, AlScN, PZT, SBT, or BTO.

9. The memory device of claim 1, wherein the memory layer comprises a variable resistance material.

10. The memory device of claim 9, wherein the memory layer comprises an oxide of at least one of Rb, Ti, Ba, Zr, Ca, Hf, Sr, Sc, B, Mg, Al, K, Y, La, Si, Be, Nb, Ni, Ta, W, V, La, Gd, Cu, Mo, Cr, or Mn.

11. The memory device of claim 1, wherein the channel layer comprises at least one of a Si, Ge, SiGe, and III-V group semiconductor, an oxide semiconductor, a nitride semiconductor, an oxynitride semiconductor, a two-dimensional (2D) material, quantum dots, and an organic semiconductor.

12. The memory device of claim 1, further comprising:

an insulating structure having a central axis parallel to the first direction, wherein the memory layer surrounds the insulating structure, the channel layer surrounds the memory layer, and each of the plurality of gate electrodes surrounds the channel layer at different positions in the first direction.

13. The memory device of claim 12, wherein the memory device has a shape of a cylindrical or polygonal pillar.

14. The memory device of claim 13, further comprising:

a stepped wiring structure including wirings extending from each of the plurality of gate electrodes by different lengths in a third direction perpendicular to the first direction.

15. A memory device comprising:

a semiconductor substrate; and a plurality of memory cell strings extending in a first direction away from the semiconductor substrate on the semiconductor substrate, and arranged in two dimensions in a second direction and a third direction, which are perpendicular to the first direction, wherein each of the plurality of memory cell strings comprises:

a plurality of gate electrodes spaced apart from each other in the first direction;

a memory layer comprising a plurality of memory regions that protrude in the second direction and extend in the second direction perpendicular to the first direction to face the plurality of gate electrodes, respectively;

a plurality of first insulating layers extending to spaces between the plurality of memory regions between the plurality of gate electrodes;

a channel layer between the memory layer and the plurality of gate electrodes, the channel layer having a shape including a plurality of first regions surrounding the plurality of memory regions and a second region that connects the plurality of first regions to each other along the first direction; and a gate insulating layer between the channel layer and the plurality of gate electrodes, wherein the plurality of first regions comprise a first part and a third part facing each other with the plurality of memory regions between the first part and the third part, and a second part arranged between the first part and the third part and facing the plurality of gate electrodes, both of the first part and the third part have a higher conductivity than the second part and the first part and the third part of the channel layer serve as electrodes of a capacitor, and the second part serves as a channel of a transistor.

16. The memory device of claim 15, wherein each of the plurality of memory cell strings further comprises: a cylindrical insulating structure having a central axis parallel to the first direction, wherein the memory layer surrounds the cylindrical insulating structure, the channel layer surrounds the memory layer, and each of the plurality of gate electrodes surrounds the channel layer at different positions in the first direction.

17. An electronic device comprising:

a memory device including a memory cell array including a plurality of memory cells, and a voltage generator configured to generate a voltage to be applied to the memory cell array; and a memory controller configured to control the memory device, wherein the memory cell array comprises:

a plurality of gate electrodes spaced apart from each other in a first direction;

a memory layer comprising a plurality of memory regions that protrude in a second direction and that extend in the second direction that is perpendicular to the first direction to face the plurality of gate electrodes, respectively;

a plurality of first insulating layers extending to spaces between the plurality of memory regions between the plurality of gate electrodes;

a channel layer between the memory layer and the plurality of gate electrodes, the channel layer having a shape including a plurality of first regions surrounding the plurality of memory regions and a second region that connects the plurality of first regions to each other in the first direction; and a gate insulating layer between the channel layer and the plurality of gate electrodes, wherein the plurality of first regions comprise a first part and a third part facing each other with the plurality of memory regions between the first part and the third part, and a second part arranged between the first part and the third part and facing the plurality of gate electrodes, both of the first part and the third part have a higher conductivity than the second part, and the first part and the third part of the channel layer serve as electrodes of a capacitor, and the second part serves as a channel of a transistor.

* * * * *